(12) United States Patent
Nakano

(10) Patent No.: US 6,788,392 B2
(45) Date of Patent: Sep. 7, 2004

(54) EXPOSURE APPARATUS, DEVICE MANUFACTURING METHOD, GAS SUBSTITUTING APPARATUS, AND GAS SUBSTITUTING METHOD

(75) Inventor: Hitoshi Nakano, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/985,240

(22) Filed: Nov. 2, 2001

(65) Prior Publication Data

US 2002/0057425 A1 May 16, 2002

(30) Foreign Application Priority Data

Nov. 16, 2000 (JP) ........................................ 2000/349568

(51) Int. Cl.[7] .................. G03B 27/58; G03B 27/62; G03B 27/52
(52) U.S. Cl. .................. 355/72; 355/75; 355/30
(58) Field of Search .................. 355/30, 53, 72–76; 378/34–35; 310/10, 12; 430/5, 20, 30

(56) References Cited

U.S. PATENT DOCUMENTS

| 5,559,584 A | * | 9/1996 | Miyaji et al. ................. 355/73 |
| 5,696,623 A | * | 12/1997 | Fujie et al. .................. 359/350 |
| 5,997,963 A | * | 12/1999 | Davison et al. .............. 427/582 |
| 6,101,237 A | * | 8/2000 | Miyachi et al. ............... 378/35 |
| 6,153,044 A | * | 11/2000 | Klebanoff et al. ........... 156/345 |
| 6,317,479 B1 | * | 11/2001 | Chiba et al. .................. 378/35 |
| 6,335,787 B1 | * | 1/2002 | Nishi ........................... 355/67 |
| 6,593,034 B1 | * | 7/2003 | Shirasaki ...................... 430/5 |
| 2002/0126269 A1 | * | 9/2002 | Sato ............................. 355/77 |

FOREIGN PATENT DOCUMENTS

| JP | 6-27643 | 2/1994 |
| JP | 9-73167 | 3/1997 |
| JP | 9-197652 | 7/1997 |
| JP | 9197652 | * 7/1997 |

OTHER PUBLICATIONS

Okabe, Hideo. "Photochemistry of Small Molecules," A Wiley–Interscience Publication, 1978, p. 178.

* cited by examiner

Primary Examiner—Henry Hung Nguyen
(74) Attorney, Agent, or Firm—Fitzpatrick, Cella, Harper & Scinto

(57) ABSTRACT

An exposure apparatus includes a support for holding (i) a pellicle-equipped reticle, the pellicle-equipped reticle including a pellicle frame having an opening, and (ii) a nozzle disposed in an opposed relation to the opening formed in the pellicle frame of the reticle held on the support, the nozzle being used to substitute an inert gas for gas in a pellicle space surrounding the reticle, the pellicle frame and a pellicle film. By purging out air including impurities from the pellicle space with the inert gas, a reduction in transmittance of exposure light through the pellicle space can be suppressed and the exposure operation can be performed with stability.

33 Claims, 17 Drawing Sheets

FIG. 11

```
URL  http://www.maintain.co.jp/db/input.html

TROUBLE DB ENTRY SCREEN

DATA OF OCCURRENCE  [2000/3/15]  ~404
MODEL  [**********]  ~401
SUBJECT  [OPERATION FAILURE (BOOTUP ERROR)]  ~403
UNIT S/N  [465NS4580001]  ~402
URGENCY LEVEL  [D]  ~405
SYMPTOMS  [LED CONTINUES BLINKING AFTER POWER-ON]  ~406
COUNTERMEASURES  [TURN ON POWER AGAIN (DEPRESS RED BUTTON AT BOOTUP)]  ~407
PROCEEDINGS  [TEMPORARILY DEALT WITH]  ~408

[SEND] [RESET]       410              411              412
            LINK TO RESULT LIST DATABASE   SOFTWARE LIBRARY   OPERATION GUIDE
```

SEMICONDUCTOR DEVICE
PRODUCTION FLOW

WAFER PROCESS

EXPOSURE APPARATUS, DEVICE MANUFACTURING METHOD, GAS SUBSTITUTING APPARATUS, AND GAS SUBSTITUTING METHOD

BACKGROUND OF THE INVENTION

1. Field of the Invention

The present invention relates to a method for substituting an inert gas for a gas (e.g., air including impurities) in a pellicle space surrounding a mask and a pellicle, which is provided to prevent foreign matter such as particles from adhering to a pattern surface. The method is suitably applied to an exposure apparatus in which a mask pattern is irradiated to a photosensitive substrate through a projection optical system by using ultraviolet light as exposure light while gas in the exposure apparatus is replaced with an inert gas. Also, the present invention relates to an exposure apparatus provided with an inert gas substituting apparatus for substituting an inert gas for a gas in the pellicle space.

2. Description of the Related Art

Hitherto, a scale-down (reduction) projection exposure apparatus for projecting and printing a circuit pattern drawn in the form of a mask as a scaled-down image on a substrate, over which a photoresist is coated, has been employed in a process for manufacturing semiconductor devices formed of very fine patterns, such as LSIs and ultra LSIs. Even finer patterns have been demanded with an increase in packing density of semiconductor devices, and exposure apparatuses have been improved to be adaptable for such a demand in step with development of the resist process.

The resolution provided by an exposure apparatus can be improved by setting the wavelength of exposure light to be shorter, or by setting the numerical aperture (NA) of a projection optical system to be greater.

The wavelength of exposure light has become shorter with the development of KrF excimer lasers having oscillation wavelengths ranging from 365 nm of the i-line to about 248 nm in a recent version, and of ArF excimer lasers having oscillation wavelengths of about 193 nm. A fluorine ($F_2$) excimer laser having an oscillation wavelength of about 157 nm has also been developed.

In connection with an ArF excimer laser having an oscillation wavelength of about 193 nm and a fluorine ($F_2$) excimer laser having an oscillation wavelength of about 157 nm, it is known that a plurality of oxygen ($O_2$) absorption bands exist in the far ultraviolet range, particularly, in the ranges near those oscillation wavelengths.

Applications of a fluorine excimer laser, for example, to an exposure apparatus have progressed because it has a short oscillation wavelength of about 157 nm. The wavelength of 157 nm resides in a wavelength range that is generally called a vacuum ultraviolet range. The reason is that since, in such a wavelength range, oxygen molecules greatly absorb light and the atmosphere (air) is hardly transmissive to light, applications of a fluorine excimer laser are feasible only under an environment in which the air pressure is reduced to a level close to a vacuum and the oxygen concentration is reduced to a sufficiently low level. According to a reference "Photochemistry of Small Molecules" (by Hideo Okabe, A Wiley-Interscience Publication, 1978, p.178), the absorption coefficient of oxygen to light having a wavelength of 157 nm is about 190 $atm^{-1}cm^{-1}$. This means that when the light having a wavelength of 157 nm passes air at 1 atm with an oxygen concentration of 1%, the transmittance per 1 cm is that as given below:

$$T=\exp(-190\times 1\ cm\times 0.01\ atm)=0.150$$

Further, ozone ($O_3$) is generated upon oxygen absorbing the above light. Various materials produced from ozone adhere to the surfaces of optical devices and hence lower the efficiency of an optical system.

In an optical path of an exposure optical system of a projection exposure apparatus which employs, as a light source, a far ultraviolet ray emitted from an ArF excimer laser, a fluorine ($F_2$) excimer or the like, therefore, the concentration of oxygen present in the optical path is reduced to a level lower than an order of several ppm by a method purging out the oxygen with an inert gas such as nitrogen.

Thus, in exposure apparatuses utilizing far ultraviolet rays, particularly, an ArF excimer laser beam having a wavelength of about 193 nm and a fluorine ($F_2$) excimer laser beam having a wavelength of about 157 nm, oxygen in an optical path must be purged out to a level lower than an order of several ppm because the ArF excimer laser beam and the fluorine ($F_2$) excimer laser beam are very easily absorbed by components of the exposure apparatus.

The above description is similarly applicable to moisture. That is, moisture ($H_2O$) must also be removed to a level lower than an order of several ppm. For that reason, it has been conventional that air containing oxygen and moisture in the interior of an exposure apparatus, especially in a path of an ultraviolet ray, is purged out with an inert gas. Also, a load lock mechanism is provided in a section communicating the interior and the exterior of an exposure apparatus with each other. When a reticle or a wafer is carried into the interior of the exposure apparatus from the exterior, it is first placed in the load lock mechanism for being cut-off from the open atmosphere and for purging-out of impurities with an inert gas. Thereafter, the reticle or the wafer is carried into the interior of the exposure apparatus.

FIG. 14 is a schematic sectional view showing one example of a semiconductor exposure apparatus which employs a fluorine ($F_2$) excimer laser as a light source and includes load lock mechanisms.

Referring to FIG. 14, reference numeral 1 denotes a reticle stage on which a reticle having a pattern drawn thereon is mounted, and 2 denotes a projection optical system for projecting the pattern on the reticle to a wafer. Numeral 3 denotes a wafer stage which mounts the wafer on it and is driven to rotate in directions of X, Y, Z, θ and tilt. Numeral 4 denotes an illumination optical system for irradiating illumination light to the reticle, and 5 denotes a guiding optical system for introducing light from a light source to the illumination optical system 4. Numeral 6 denotes a fluorine ($F_2$) excimer laser unit as the light source, and 7 denotes a masking blade for blocking off the exposure light so that only a pattern area on the reticle is illuminated. Numerals 8 and 9 denote housings provided respectively around the reticle stage 1 and the wafer stage 3 to enclose an axis of the exposure light. Numeral 10 denotes a He gas conditioner for adjusting atmospheres in the projection optical system 2 and the illumination optical system 4 to a predetermined He atmosphere. Numerals 11 and 12 denote $N_2$ gas conditioners for adjusting atmospheres in the housings 8 and 9, respectively, to predetermined $N_2$ atmospheres. Numerals 13 and 14 respectively denote a reticle load lock and a wafer load lock used when carrying the reticle and the wafer into the housings 8 and 9. Numerals 15 and 16 respectively denote a reticle hand and a wafer hand for carrying the reticle and the wafer. Numeral 17 denotes a reticle alignment mark used for adjusting the reticle position, 18 denotes a reticle storage device for storing a plurality of reticles in the housing 8, and 19 denotes a pre-alignment unit for making pre-alignment of the wafer. Further, if necessary, the entirety of the exposure apparatus is placed in an environment chamber (not shown), and the temperature in the environment chamber is controlled to be kept constant by circulating air controlled at a predetermined temperature in the environment chamber.

FIG. 15 is a schematic sectional view showing another example of a semiconductor exposure apparatus which employs a fluorine ($F_2$) excimer laser as a light source and includes load lock mechanisms.

In the example of FIG. 15, a housing 20 covers the entirety of the exposure apparatus, and $O_2$ and $H_2O$ present in the housing 20 are purged out with an $N_2$ gas. Numeral 21 denotes an $N_2$ gas conditioner for establishing an $N_2$ gas atmosphere in the entire inner space of the housing 20. In this exposure apparatus, inner spaces of a lens barrel 2 and an illumination optical system 4 are isolated from the inner space (driving system space) of the housing 20 to form a He atmosphere therein independently. Numerals 13 and 14 respectively denote a reticle load lock and a wafer load lock used when carrying a reticle and a wafer into the housing 20.

Generally, a pattern protection device, called a pellicle, is attached to a reticle. The pellicle serves to prevent foreign matter, such as dust, from adhering to a pattern surface of the reticle, and to reduce the frequency of failure occurrence due to transfer of the foreign matter onto a wafer.

FIG. 16 is a schematic view showing a structure of the pellicle. A pellicle 24 is bonded to the pattern surface side of a reticle 23 using an adhesive or the like. The pellicle 24 comprises a support frame 25 having a size large enough to surround a reticle pattern, and a pellicle film 26 bonded to one end surface of the support frame 25 and allowing the exposure light to pass through it. If a space (referred to as a "pellicle space" hereinafter) surrounding the reticle 23, the support frame 25 and the pellicle film 26 is completely enclosed, the pellicle film 26 may expand or contract due to a pressure difference and an oxygen concentration difference between the interior and the exterior of the pellicle space. To avoid such a drawback, a vent hole 27 is formed in the pellicle frame 25 so that gas is able to communicate between the interior and the exterior of the pellicle space. Also, a dust removing filter (not shown) is disposed in a vent passage to prevent foreign matter from entering the pellicle space through the vent hole 27.

FIG. 17 is a schematic view showing one example of reticle carrying paths in each of the exposure apparatuses shown in FIGS. 14 and 15.

Referring to FIG. 17, numeral 22 denotes a foreign matter inspecting apparatus for measuring the size and number of particles of foreign matter, such as dust, adhering to the reticle surface and the pellicle film surface. The reticle 23 is carried into the reticle load lock 13, which serves as an entrance of the exposure apparatus, manually or by a carrying apparatus (not shown). Since the reticle 23 and the pellicle 24 are generally bonded to each other outside the exposure apparatus, the pellicle 24 is already bonded to the reticle 23 at the time when the latter is carried into the reticle load lock 13. Then, air in the reticle load lock 13 is purged out with an inert gas. After an inert gas atmosphere comparable to that in the housing 8 has been formed, the reticle 23 is carried by the reticle hand 15 to one of the reticle stage 1, the reticle storage device 18 and the foreign matter inspecting apparatus 22.

As described above, in exposure apparatuses utilizing far ultraviolet rays, particularly, an ArF excimer laser beam and a fluorine ($F_2$) excimer laser beam, oxygen and moisture greatly absorb light at the wavelengths of the ArF excimer laser beam and the fluorine ($F_2$) excimer laser beam. Therefore, the concentrations of oxygen and moisture must be reduced in order to obtain satisfactory levels of transmittance and stability. Also, for the purpose of closely controlling those concentrations, a load lock mechanism is provided in a section communicating the interior and the exterior of the exposure apparatus with each other. When a reticle or a wafer is carried into the interior of the exposure apparatus from the exterior, it is first placed in the load lock mechanism for being cut-off from the open atmosphere and for purging-out of impurities with an inert gas. Thereafter, the reticle or the wafer is carried into the interior of the exposure apparatus.

However, a pellicle is already bonded to the reticle which is carried into the load lock chamber, and a pellicle space is communicated with an ambient atmosphere only through a relatively small vent hole. Because of such a structure, even after an inert gas in the load lock chamber has reached a predetermined concentration, a still longer time is required until air in the pellicle space is completely replaced with the inert gas, and, therefore, the productivity deteriorates.

Furthermore, regarding a vent hole formed in a pellicle frame, Japanese Unexamined Patent Application Publication Nos. 6-27643, 9-197652, and so on, disclose inventions wherein intake and exhaust holes are provided. Even with an increase in the number and area of the holes, however, a gas replacement time through the holes is still longer than that required for the load lock chamber through which air is forcibly purged out. This is because, if an assembly of the reticle and the pellicle is simply placed in an inert gas atmosphere, a diffusion phenomenon due to a difference in inert gas concentration between the interior and the exterior of the pellicle space is a primary gas replacement mechanism. When a valve or a dust removing filter is disposed in a passage communicating with the hole, the gas replacement time is further prolonged.

Also, Japanese Patent Laid-Open No. 9-73167 discloses an invention wherein a reticle and a pellicle are bonded to each other beforehand in an inert gas atmosphere so that an inert gas is sealed in a pellicle space with an oxygen concentration of not more than 1%. As described above, however, the transmittance of light having a wavelength of 157 nm is only 15% per 1 cm in a gas under the atmospheric pressure with an oxygen concentration of 1%. Considering that the air gap between the reticle and the pellicle film is about 6 mm at present, even if a gas with an oxygen concentration of 0.1% is filled in the pellicle space, the transmittance of light having a wavelength of 157 nm through the air gap is only 89.2%. On the other hand, a total space distance of an optical path from a light source to a wafer in an exposure apparatus exceeds at least 1 m. To ensure the transmittance of not more than 80% through the space of 1 m, the oxygen concentration must be suppressed to a level not more than 10 ppm V/V, and an ideal target is not more than 1 ppm. From the standpoint of making a balance with other spaces and ensuring satisfactory transmittance over the total space distance, the oxygen concentration of at least 1 to 100 ppm is required for the pellicle space. Of course, the above description is similarly applied to the concentrations of moisture and carbon dioxide as well.

Even when an inert gas is sealed in the pellicle space with an oxygen concentration of the ppm order, the following problems have occurred. Because the interface at which the pellicle frame and the reticle are bonded to each other is not of a completely airtight structure, oxygen enters the pellicle space through minute gaps if the oxygen concentration in a space where the reticle and the pellicle are placed is higher than that in the pellicle space. It has hence been very difficult to maintain the oxygen concentration of the ppm order in the pellicle space rather than the % order. In the case of the pellicle film being formed of a fluorocarbon resin, because such a resin is permeable to oxygen, it has been more difficult to maintain the oxygen concentration of the ppm order in the pellicle space. Accordingly, there has been a possibility that the reticle is mounted on the reticle stage and the exposure operation is performed in spite of the pellicle space being in a condition where the inert gas concentration is not at a sufficient level. In such a case, since the inert gas concentration in the pellicle space gradually approaches that in the ambient atmosphere while the reticle is mounted on the reticle stage, the transmittance of exposure light through the pellicle space varies over time. As a result, the predetermined amount of exposure light is not obtained on a wafer with stability, and trouble such as a dimensional change in a transferred pattern occurs.

Moreover, when a pellicle-equipped reticle is stored in an atmospheric environment outside an exposure apparatus, a large number of water molecules adhere to the surfaces of a pellicle film, a pellicle frame, etc., in many cases. Even when a pellicle-equipped reticle is stored in an inert gas environment, there is a similar problem because it may be subjected to an external atmospheric environment while being carried into the exposure apparatus.

The amount of water molecules adhering to those surfaces greatly depends upon microscopic roughness and properties of the surfaces, particularly upon whether the surfaces are hydrophilic or hydrophobic. Further, in the case of using resin materials, some types of resins absorb moisture even though in a small amount. In particular, the pellicle film and the dust removing filter are highly likely formed of fluorocarbon resin materials. This means a possibility that a large amount of moisture adheres to the surfaces of those components and is absorbed therein.

In such a case, even when air in the pellicle space is replaced with an inert gas, it is very difficult to reduce the moisture concentration to a level of the ppm order in a short period of time because water molecules adhering to the surfaces of the components and absorbed therein are gradually dissociated into the inert gas. The moisture concentration can be reduced during the purging period by sufficiently increasing the flow rate of the inert gas supplied. However, dissociation of moisture occurs continuously even after the purging process is stopped, and, hence, the moisture concentration in the small pellicle space continues to increase gradually.

When the pattern exposure is performed using such a reticle, the transmittance of exposure light through the pellicle space varies gradually over time. As a result, the predetermined amount of exposure light is not obtained on a wafer with stability, and trouble such as a dimensional change in a transferred pattern occurs.

SUMMARY OF THE INVENTION

With the view of overcoming the above-mentioned problems in the art, it is an object of the present invention to provide a method for effectively substituting an inert gas for a gas (e.g., air including impurities) in a space substantially enclosing by a reticle and a pellicle in an exposure apparatus in which a mask pattern is irradiated to a photosensitive substrate through a projection optical system by using ultraviolet light as exposure light while gas in the exposure apparatus is replaced with an inert gas.

To achieve the above object, according to a first aspect of the present invention, an exposure apparatus comprises a support for holding (i) a pellicle-equipped reticle, the pellicle-equipped reticle including a pellicle frame having an opening, and (ii) a nozzle disposed in an opposed relation to the opening formed in the pellicle frame of the reticle held on the support, the nozzle being used to substitute an inert gas for gas in a pellicle space surrounding the reticle, the pellicle frame and a pellicle film.

According to a second aspect of the present invention, a method of manufacturing a semiconductor device comprises the steps of installing a group of manufacturing apparatuses for various processes, including the exposure apparatus set forth above, in a semiconductor device manufacturing factory, and manufacturing a semiconductor device through the various processes by employing the group of manufacturing apparatuses.

According to a third aspect of the present invention, a gas substituting apparatus comprises a support for holding (i) a pellicle-equipped reticle, the pellicle-equipped reticle including a pellicle frame having an opening, and (ii) a nozzle disposed in an opposed relation to the opening formed in the pellicle frame of the reticle held on the support, the nozzle being used to substitute an inert gas for gas in a pellicle space surrounding the reticle, the pellicle frame and a pellicle film.

According to a fourth aspect of the present invention, a gas substituting method comprises the steps of holding a pellicle-equipped reticle, a pellicle-equipped reticle, the pellicle-equipped reticle including a pellicle frame having an opening, and positioning a nozzle in an opposed relation to the opening formed in the pellicle frame, and using the nozzle to substitute an inert gas for gas in a pellicle space surrounding the reticle, the pellicle frame and a pellicle film.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 shows a practical example of a user interface.

DESCRIPTION OF THE PREFERRED EMBODIMENTS

Preferred embodiments of the present invention will be described in detail in accordance with the accompanying drawings.

The present invention is applicable to an exposure apparatus in which a mask pattern is irradiated onto a photosensitive substrate through a projection optical system by using ultraviolet light as exposure light while air in the exposure apparatus is replaced with an inert gas.

The ultraviolet light used as exposure light in the exposure apparatus of the present invention is not limited to a particular one. As described above in connection with the related art, however, the present invention is effectively adapted for use with far ultraviolet rays, particularly, an ArF excimer laser beam having a wavelength of about 193 nm and a fluorine ($F_2$) excimer laser beam having a wavelength of about 157 nm.

First Embodiment

Figure 1:
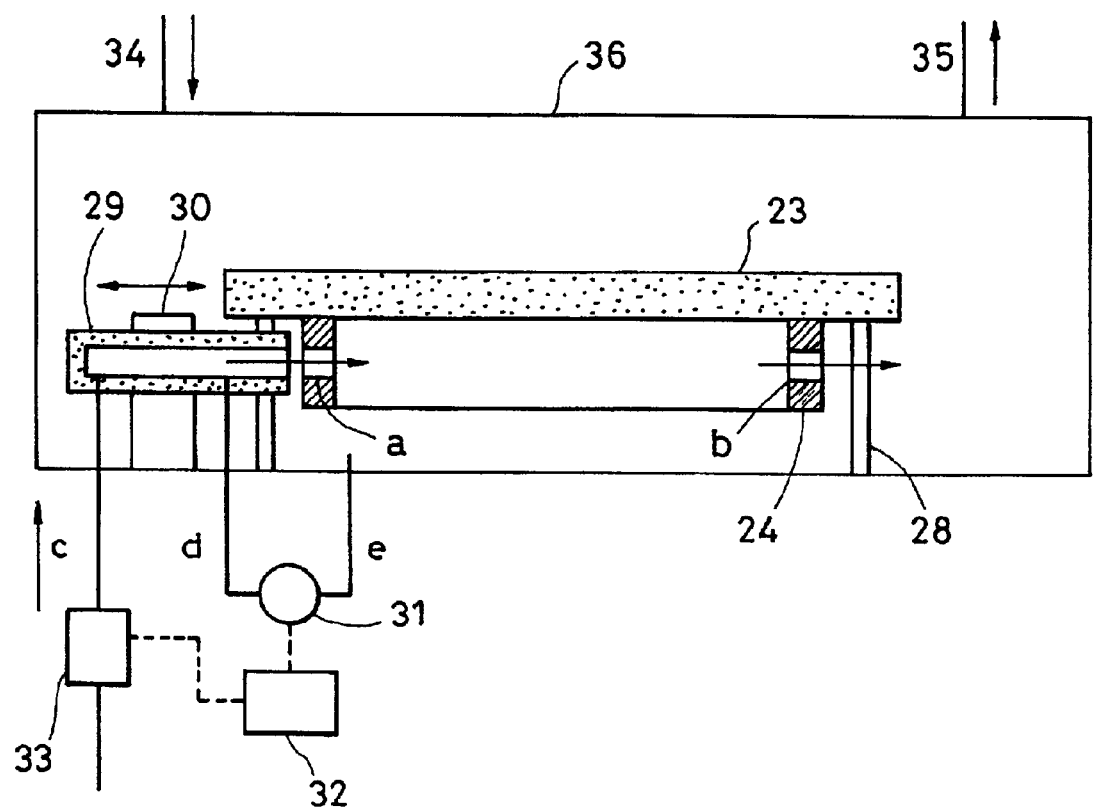
FIG. 1 shows a purging apparatus for performing purging with an inert gas using a supply nozzle according to a first embodiment of the present invention.

FIG. 1 schematically shows a purging mechanism for purging out air in a pellicle space with an inert gas according to a first embodiment of the present invention.

Figure 14:
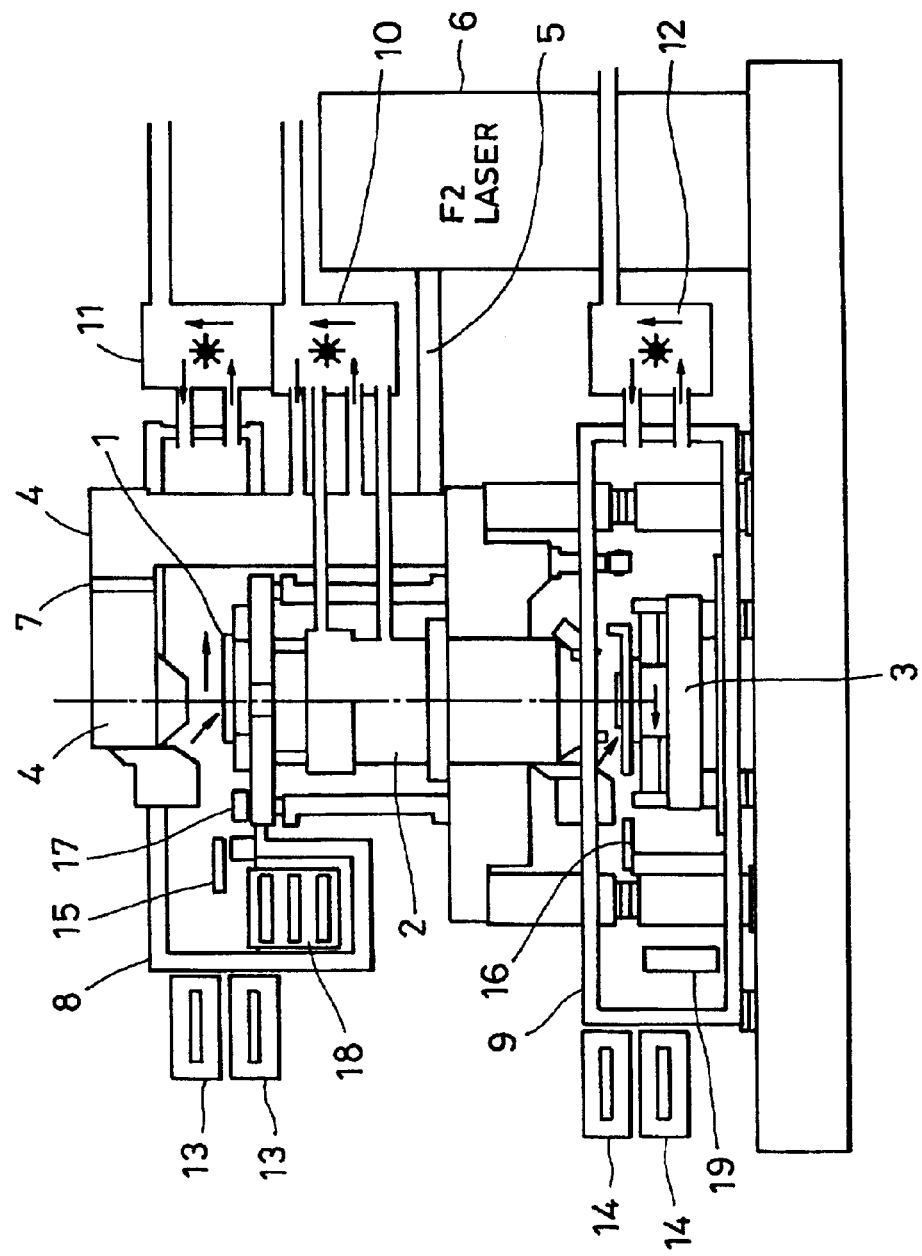
FIG. 14 is a schematic view of one projection exposure apparatus.
Figure 15:
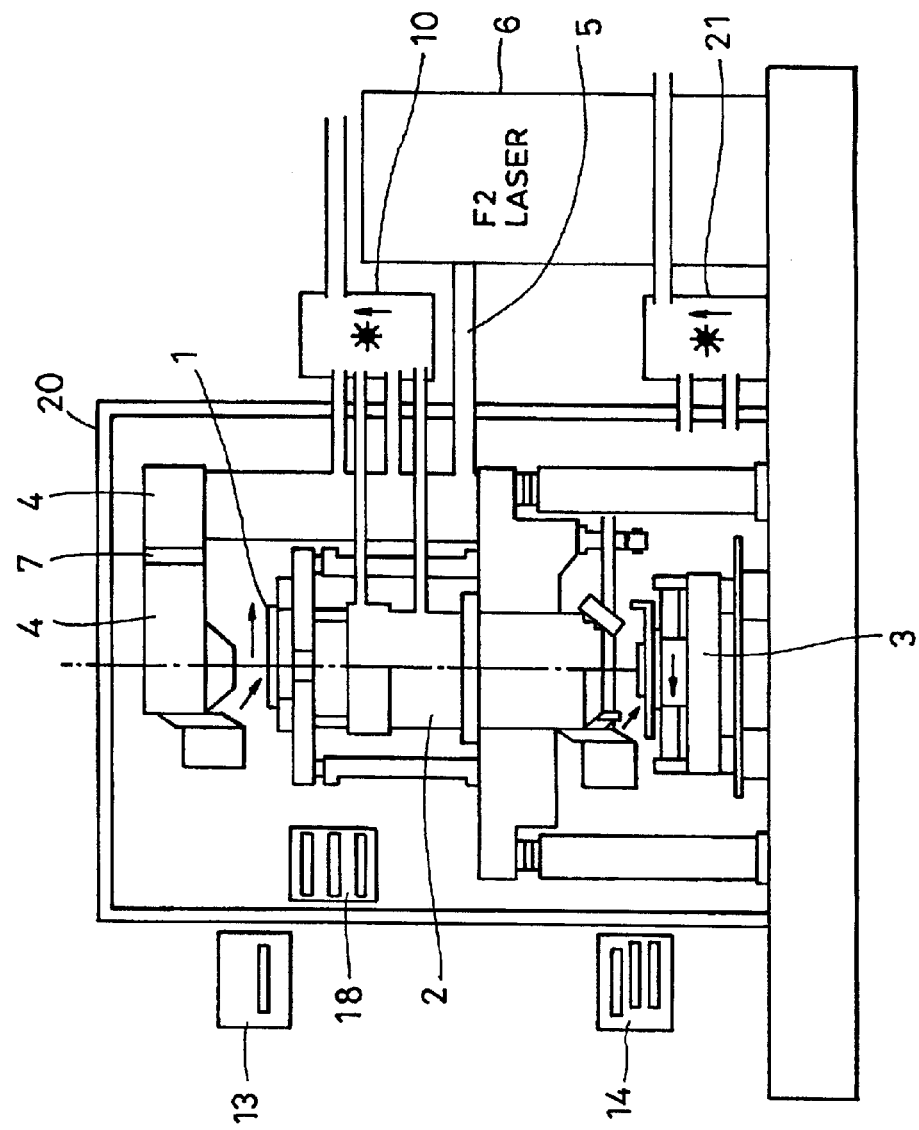
FIG. 15 is a schematic view of another projection exposure apparatus.
Figure 16:
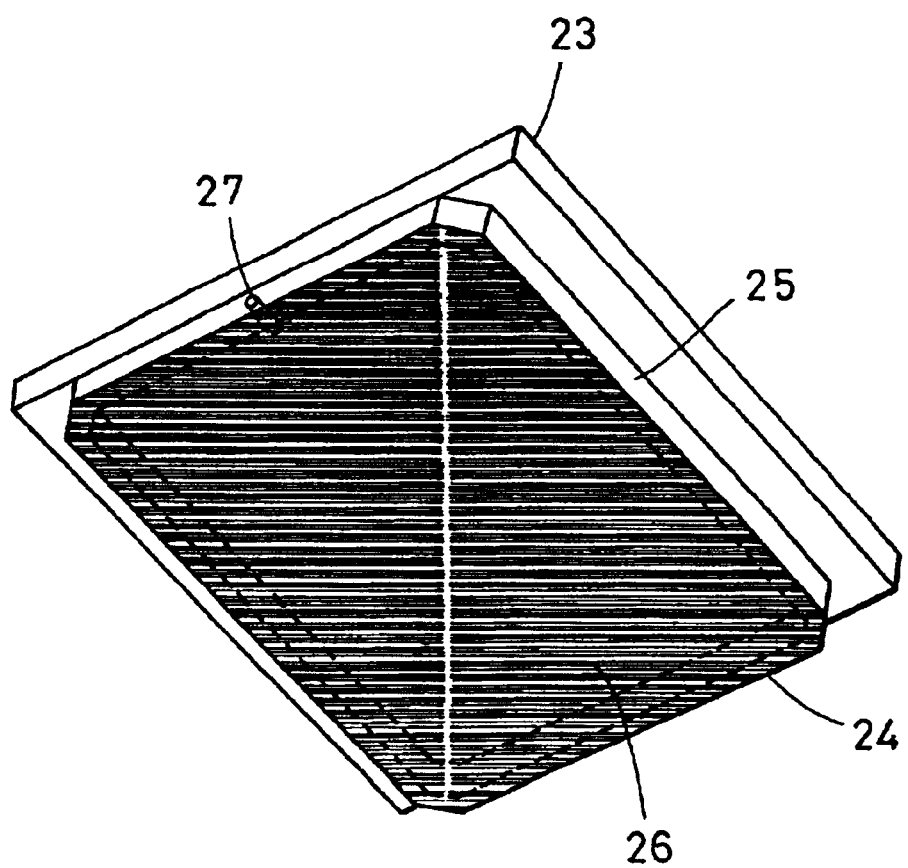
FIG. 16 is a schematic view of a pellicle bonded to a reticle.
Figure 17:
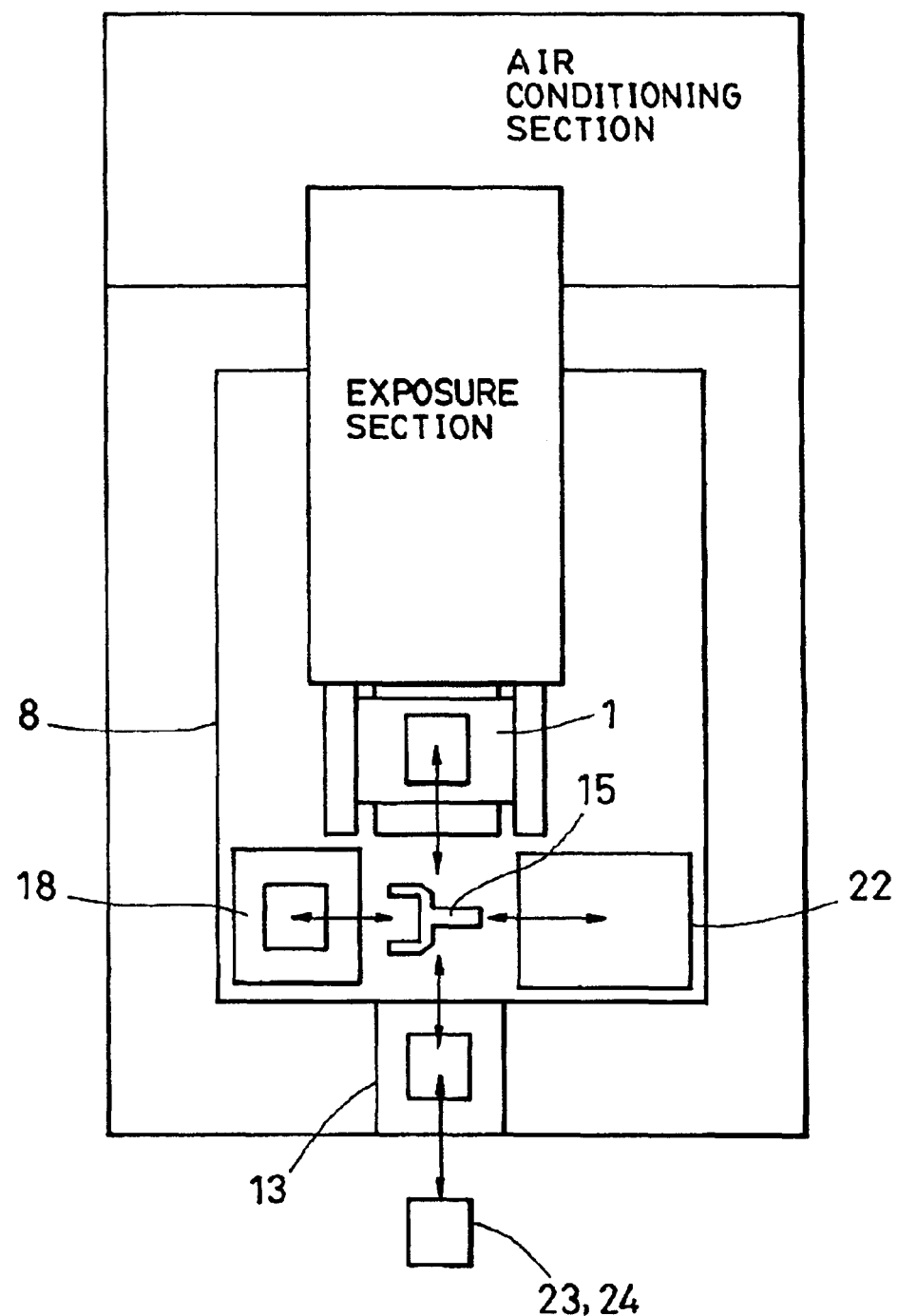
FIG. 17 is a schematic view showing, in particular, reticle carrying paths in the projection exposure apparatus.

Referring to FIG. 1, an outer airtight chamber 36 corresponds to the housing 8 shown in FIG. 14, in which a reticle stage and a reticle storage are provided, or to the reticle load lock 13. An inert gas is introduced to the interior of the airtight chamber 36 through an inert gas supply port 34 and is discharged to the exterior through a gas discharge port 35, whereby air in the airtight chamber 36 is purged out with the inert gas. Although not only the supplied inert gas, but also air and an impurity gas originally present in the airtight chamber are purged out, they are referred to collectively as a "gas" hereinafter.

A reticle support 28 is provided in a reticle carrying path in the housing 8. A reticle 23 including a pellicle 24 bonded to it (referred to as a "pellicle-equipped reticle") is mounted at a predetermined location on the support 28 by a reticle hand (not shown), or by a transfer robot (not shown) provided outside the airtight chamber 36, or manually, while it is precisely positioned. The support 28 may be provided, if necessary, with a suction groove for vacuum attraction of the reticle 23 to be fixed in place. Also, a positioning mechanism (not shown) may be separately provided for more precisely positioning the reticle 23 on the support 28. Such a positioning mechanism enables various nozzles (described later) to be more precisely positioned with respect to the pellicle frame, and hence contributes to minimizing a leak of the inert gas.

An inert gas supply port a and a gas discharge port b are formed in the pellicle frame of the pellicle 24 beforehand. An inert gas supply nozzle 29 and a nozzle moving mechanism 30 are disposed with a predetermined spacing left from the inert gas supply port a formed in the pellicle frame. The nozzle moving mechanism 30 has a guide and a driver capable of moving the nozzle at least in one direction. A positioning mechanism is preferably provided for aligning the inert gas supply nozzle 29 with a predetermined position, in particular, for setting the relative positional relationship between an end surface of the pellicle frame or the inert gas supply/discharge port formed in the pellicle frame and an end of each of the various nozzles so that they are positioned in contact with each other as close as possible.

An inert gas supply apparatus (not shown) is connected to one end of the inert gas supply nozzle 29 through a supply path c, and a flow regulator 33 is provided midway of the supply path c for regulating the flow rate of the inert gas supplied. Also, a pressure sensor 31 is connected to pressure propagating paths d, e for detecting both the pressure in the inert gas supply nozzle 29 and the pressure in a space of the airtight chamber 36 where the pellicle 24 is placed, or the difference between both the pressures. A control unit 32 controls the amount of regulation of the flow regulator 33 based on the control theory regarding an open loop or a feedback loop, such as PID control, so that the pressure value detected by the pressure sensor 31 is held within a predetermined range. As a matter of course, the arrangement of the pressure sensor is not limited to the above-described one, and the pressure sensor may be provided directly in each of the nozzle and the airtight chamber. That modified arrangement is advantageous from the viewpoint of pressure control because the pressure propagating paths d, e can be omitted and a pressure response time can be shortened.

A process for purging out air in a pellicle space with an inert gas will be described with reference to FIG. 1.

The reticle 23 including the pellicle 24 bonded thereto is placed at the predetermined location on the reticle support 28 by a reticle hand or a transfer robot (both not shown), or manually, while it is precisely positioned. The inert gas supply nozzle 29 is on standby at a predetermined position beforehand. After, or at the same time as, the reticle 23 is placed on the reticle support 28, the inert gas supply nozzle 29 is positioned by the nozzle moving mechanism 30 so as to closely contact with or slightly space from the inert gas supply port a formed in the pellicle frame. Then, an inert gas is supplied from the inert gas supply apparatus (not shown) to the nozzle 29 through the supply path c, and is blown into the pellicle space through the supply port a formed in the pellicle frame. The blown-in inert gas is mixed with oxygen, moisture and other impurities present in the pellicle space, and is forced to flow out to the exterior of the pellicle space through the discharge port b formed in the pellicle frame. The pressure sensor 31 is always monitoring the pressure difference between the end of the supply nozzle 29 and the interior of the airtight chamber 36 through the pressure propagating paths d, e at least during the supply of the inert gas. The detected pressure value is sent to the control unit 32. The control unit 32 controls the flow regulator 33 to regulate the flow rate of the inert gas supplied to the supply nozzle 29 so that the above pressure difference is always held smaller than a threshold preset for preventing a deformation or breakage of the pellicle film and detachment of the pellicle frame from the reticle 23.

Second Embodiment

Figure 2:
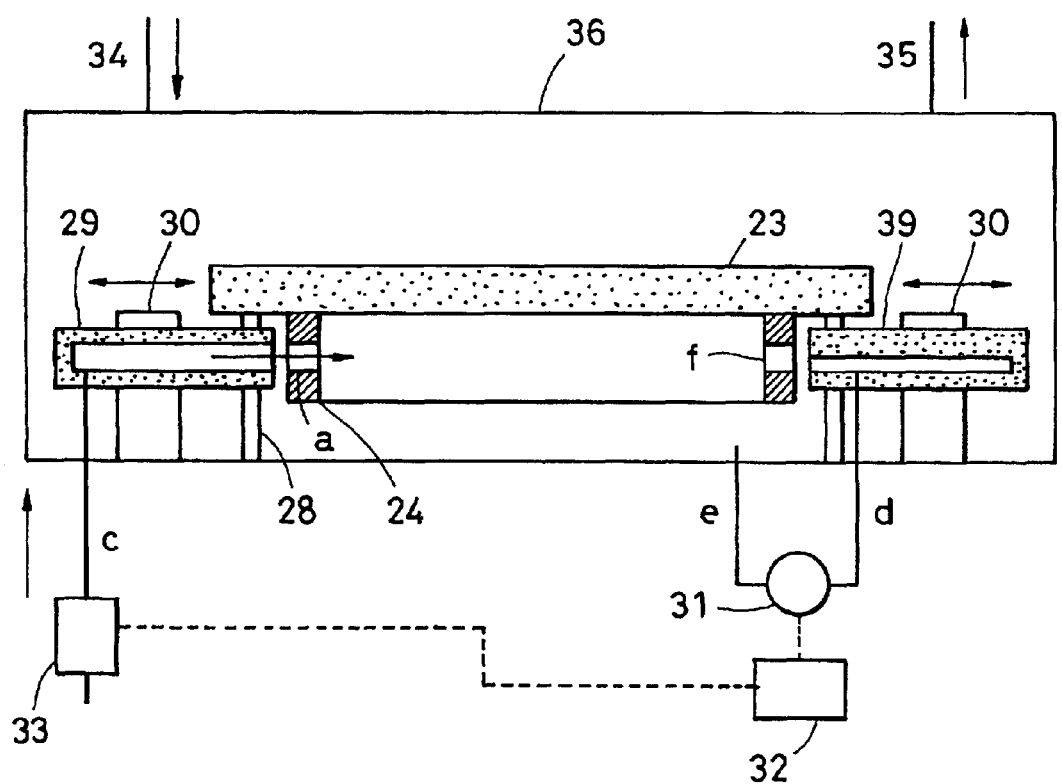
FIG. 2 shows a purging apparatus for performing purging with an inert gas using a supply nozzle and a pressure detecting nozzle according to a second embodiment of the present invention.

FIG. 2 shows a second embodiment in which the pressure in the pellicle space is directly detected using a nozzle.

While in the above first embodiment the inert gas supply pressure in the supply nozzle is detected and employed instead of the pressure in the pellicle space, this second embodiment is intended to more closely detect the pressure in the pellicle space. An inert gas supply nozzle 29 and a pressure detecting nozzle 39 are positioned by associated nozzle moving mechanisms 30 so as to closely contact with or be slightly spaced from an inert gas supply port a and a pressure detecting hole f both formed in the pellicle frame, respectively. The pressure detecting nozzle 39 is connected through one pressure propagating path d to a pressure sensor 31, which is also connected to the interior of an airtight chamber 36 through the other pressure propagating path e. Thus, the pressure sensor 31 detects the pressure difference between the pressure in the pellicle space and the pressure in the airtight chamber 36. The flow rate of the supplied inert gas is regulated so that the detected pressure difference is always held not larger than a predetermined value. Additionally, the inert gas supplied to the pellicle space through the supply port a is forced to flow out to the exterior of the pellicle space through a discharge port (not shown).

Third Embodiment

Figure 3:
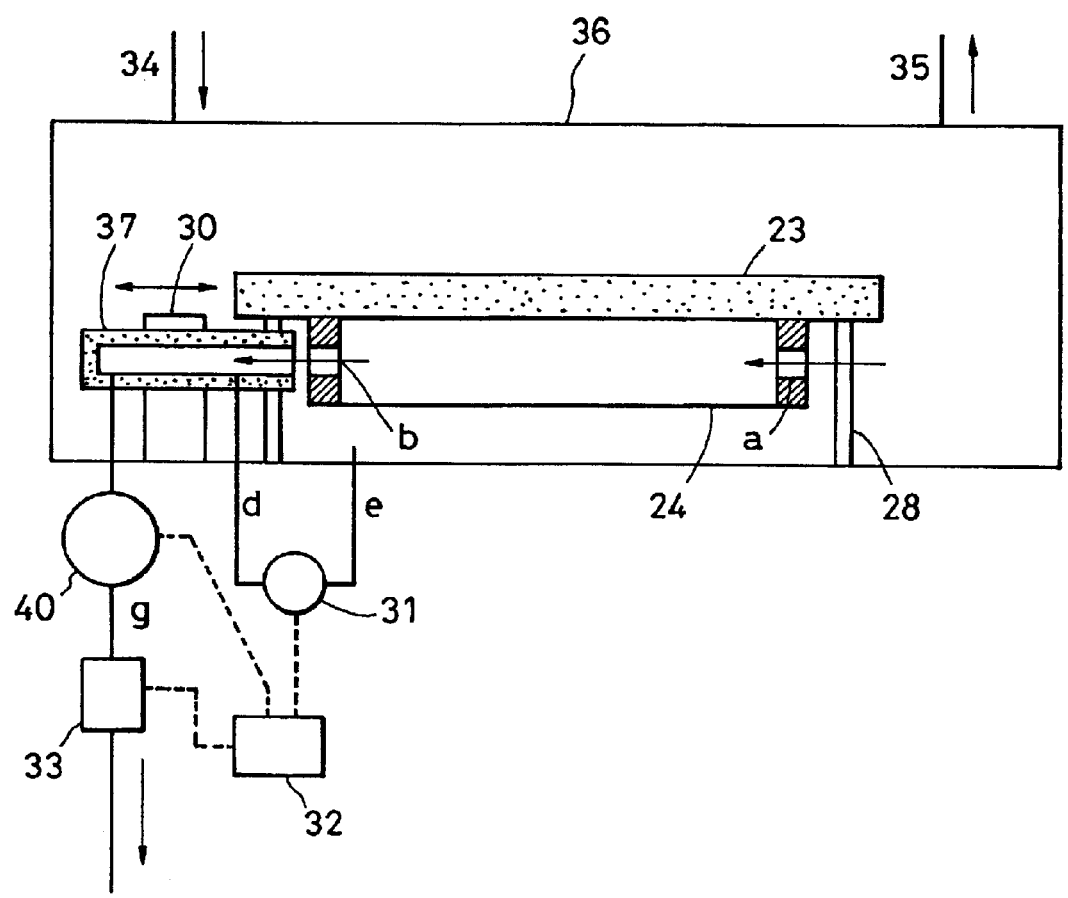
FIG. 3 shows a purging apparatus for performing purging with an inert gas using a discharge nozzle according to a third embodiment of the present invention.

FIG. 3 shows a third embodiment of the present invention.

While in the above first and second embodiments the inert gas is blown into the pellicle space through the supply nozzle, this third embodiment differs from them in that air in the pellicle space is sucked by a discharge nozzle 37 and is forcibly discharged to the exterior of the pellicle space, thereby causing the inert gas in the airtight chamber to be introduced to the pellicle space.

More specifically, in FIG. 3, the discharge nozzle 37 is positioned by a nozzle moving mechanism 30 so as to closely contact with or be slightly spaced from a discharge port b formed in the pellicle frame. The discharge nozzle 37 is connected through a discharge path g to an inert gas sucking apparatus (not shown), which sucks air in the pellicle space. Sucking air in the pellicle space enables the inert gas in the airtight chamber to be introduced to the pellicle space through an inert gas supply port a formed in the pellicle frame. As a result, air in the pellicle space is replaced by the inert gas.

The pressure sensor 31 detects the pressure difference between the pressure in the pellicle space and the pressure in the outer airtight chamber. The flow rate of the sucked inert gas including air is regulated so that the detected pressure difference is always held not higher than a predetermined value. That control process is similar to that in the first embodiment of FIG. 1. Of course, a dedicated pressure detecting nozzle may be provided, as shown in FIG. 2, to detect the pressure directly in the pellicle space. When replacing air in the pellicle space with the inert gas, it is required to increase the amount of the inert gas supplied to the airtight chamber through the supply port 34 or to reduce the amount of the gas discharged through the discharge port 35 in an amount by which the inert gas in the airtight chamber is discharged through the discharge path g. That resupply of the inert gas to the airtight chamber may be passive or active.

This embodiment is advantageous in that the pressure in the pellicle space is always negative, even though slightly, relative to the pressure in the outer airtight chamber, which is effective at least in preventing the pellicle frame from detaching from the reticle. Another advantage is that since the inert gas in the airtight chamber is introduced to the pellicle space, the impurity concentration in the pellicle space can be easily made exactly the same as that in the airtight chamber, and it is less likely to change over time due to the concentration difference and diffusion. Further, as shown in FIG. 3, an impurity concentration sensor 40 for detecting the concentration of impurities in the inert gas may be disposed midway of the discharge path g. With the provision of the impurity concentration sensor 40, it is possible to detect the concentration of impurities in gas residing in the pellicle space sucked through the discharge nozzle 37 together with the inert gas, and to continue sucking through the discharge nozzle 37 just until the detected impurity concentration is reduced to a level not higher than a preset threshold. This leads to advantages that air in the pellicle space can be surely replaced by the inert gas at a predetermined concentration, and a replacement time is not required to prolong longer than needed in consideration of an excessive allowance. The flow rate of the discharged gas may be controlled depending on an output of the impurity concentration sensor 40. The impurity concentration sensor 40 includes, for example, any one or both of an oxygen concentration sensor and a moisture concentration sensor. An atmospheric pressure ionization sensor may also be used which ionizes impurities in the inert gas, such as $H_2O$, $O_2$, $CO_2$ and organic materials, and detects the impurities with high sensitivity. Using such an ionization sensor enables a total amount of impurities to be detected, and therefore provides an advantage of realizing more precise detection of the concentration of impurities in the inert gas.

Fourth Embodiment

Figure 4:
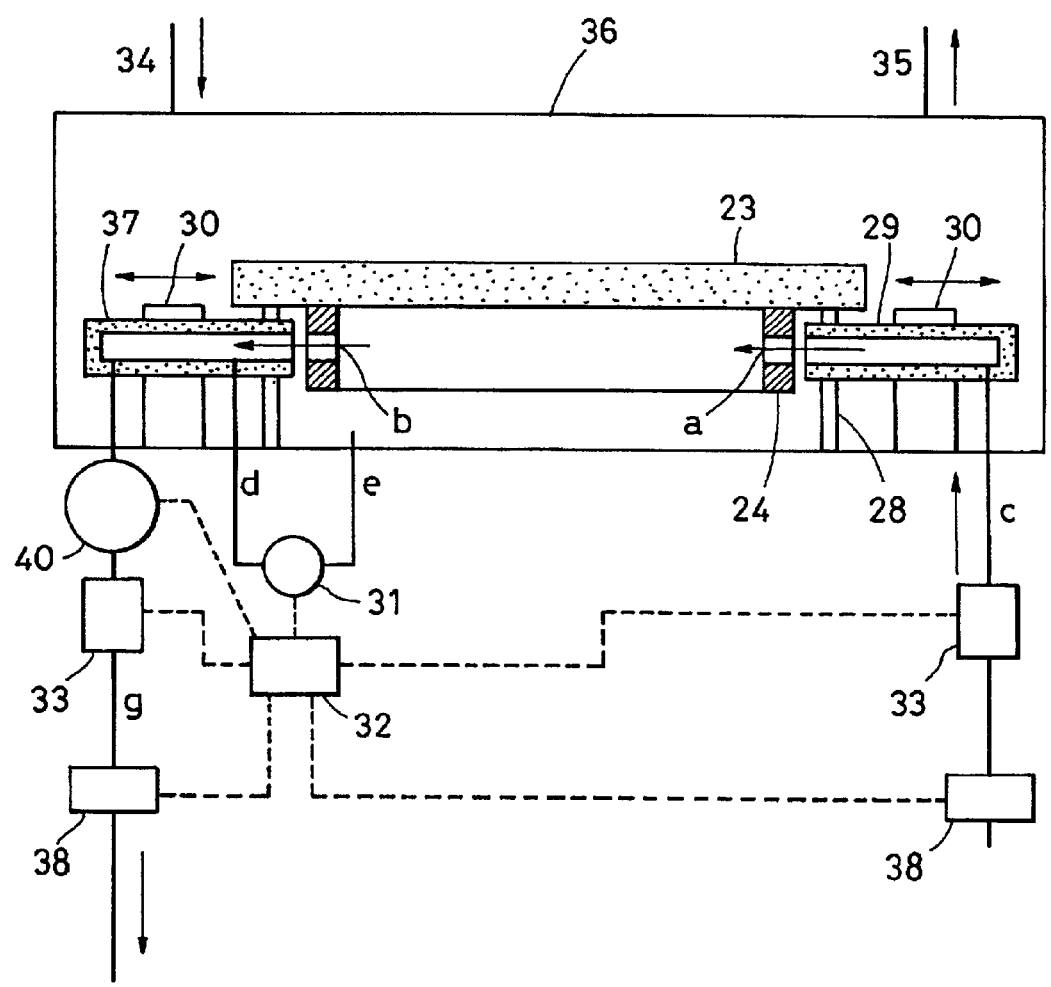
FIG. 4 shows a purging apparatus for performing purging with an inert gas using a supply nozzle and a discharge nozzle according to a fourth embodiment of the present invention.

FIG. 4 shows a fourth embodiment of the present invention.

While in the above embodiments, the inert gas is introduced to the pellicle space through the supply nozzle or the discharge nozzle, this fourth embodiment employs both an inert gas supply nozzle 29 and a discharge nozzle 37, the supply nozzle 29 blowing the inert gas into the pellicle space, the discharge nozzle 37 sucking air in the pellicle space.

Referring to FIG. 4, the inert gas supply nozzle 29 and the discharge nozzle 37 are positioned by associated nozzle moving mechanisms 30 so as to closely contact with or be slightly spaced from an inert gas supply port a and a discharge port b both formed in the pellicle frame, respectively. The supply nozzle 29 and the discharge nozzle 37 are connected to an inert gas supply apparatus and a gas sucking apparatus (both not shown) through a supply path c and a discharge path g, respectively, whereby the inert gas is blown into the pellicle space, while air in the pellicle space is sucked and discharged to the exterior of an airtight chamber 36. The flow rate of the inert gas supplied to the pellicle space and the flow rate of the inert gas sucked from the pellicle space are controlled by a control unit 32 and a flow regulator 33 so that both the flow rates are always held at the same value.

Also, as shown in FIG. 4, a pressure sensor 31 detects the pressure difference between the pressure in the pellicle space and the pressure in the airtight chamber. One or both of the flow rate of the supplied inert gas and the flow rate of the discharged inert gas may be regulated so that the detected pressure difference is always held not larger than a preset threshold. By thus forcibly supplying and discharging the gas with the inert gas almost at the same time, a pressure slope in the pellicle space can be distributed to be positive and negative with respect to the pressure in the outer airtight chamber 36. More specifically, the pressure in the pellicle space at a position near the supply nozzle 29 becomes positive (plus) with respect to the pressure in the outer airtight chamber 36, and the pressure in the pellicle space at a position near the discharge nozzle 37 becomes negative (minus) with respect to the pressure in the outer airtight chamber 36. By thus distributing the pressure slope in the pellicle space to be positive and negative with respect to the pressure in the outer airtight chamber 36, a maximum pressure difference between the pressure in the pellicle space and the pressure in the outer airtight chamber 36 can be reduced to be about ½ of that resulting when the inert gas is supplied or discharged at the same flow rate through the supply or discharge nozzle. In the case of setting the pressure difference to the same threshold, therefore, the inert gas can be supplied and discharged at an increased flow rate in this embodiment. Hence, the replacement time can be cut down.

Also, in the case of setting the supply/discharge flow rate to the same value, the above pressure difference is held smaller in this embodiment, thus resulting in an advantage that a deformation or breakage of the pellicle film and detachment of the pellicle frame from the reticle are less likely to occur.

While the pressure sensor 31 is arranged to detect the pressure in the discharge nozzle 37 in FIG. 4, it may be arranged to detect the pressure in the supply nozzle 29. Further, two pressure sensors may be separately provided to detect the pressure in the discharge nozzle 37 and the pressure in the supply nozzle 29, and the supply flow rate and the discharge flow rate of the inert gas may be separately controlled so that the detected pressure differences between the pressures in the discharge and supply nozzles 37, 29 and the pressure in the airtight chamber 36 are always held not larger than respective preset thresholds. Alternatively, a common threshold may be set with respect to absolute values of both of the detected pressure differences, and one of the supply flow rate and the discharge flow rate of the inert gas may be controlled so that both of the detected pressure differences are always held not larger than the common preset threshold. As an alternative, the supply flow rate and the discharge flow rate of the inert gas may be controlled so that both of the flow rates are always held at the same value.

As with the third embodiment, an impurity concentration sensor 40 for detecting the concentration of impurities in the inert gas may be disposed midway of the discharge path g. With the provision of the impurity concentration sensor 40, it is possible to detect the concentration of impurities in gas residing in the pellicle space sucked through the discharge nozzle 37 together with the inert gas, and to continue the supply and discharge of the inert gas just until the detected impurity concentration is reduced to a level not higher than a preset threshold.

In the above embodiments, the pressure difference between the pressure in the pellicle space and the pressure in the outer airtight chamber is used as an index value representing the occurrence of a deformation or breakage of the pellicle film and detachment of the pellicle frame from the reticle. It is, however, also possible to provide, e.g., a means for optically or electrically detecting a deformation of the pellicle film and the pellicle frame, and to control the supply flow rate and the discharge flow rate of the inert gas so that the detected deformation is always held not larger than a preset threshold.

Moreover, the inert gas supplied to the pellicle space or the airtight chamber 36 may be heated by a heating apparatus (not shown) before the supply. Heating the inert gas is advantageous in that water molecules adhering to and absorbed by the surfaces of the reticle and the pellicle are activated and dissociation of moisture into the inert gas can be completed in a shorter time. Of course, an inert gas cooling apparatus for cooling the inert gas or a temperature controller for controlling the inert gas to a predetermined temperature may be provided in addition to the heating apparatus so that cooling of the heated inert gas can be completed in a relatively short time.

The inert gas supply nozzle 29, the discharge nozzle 37, the nozzle moving mechanisms 30, and the reticle support 28, shown in FIGS. 1 to 4, may be provided on the reticle stage to continuously purge out gas in the pellicle space with the newly supplied inert gas at least during the exposure operation. With such continued purging, even in a condition where water molecules adhering to and absorbed by the surfaces of the reticle and the pellicle are not yet sufficiently dissociated, stable transmittance of the exposure light can be obtained by controlling the flow rate of the inert gas supplied to the pellicle space so that the impurity concentration in the pellicle space be held not higher than the predetermined threshold.

Also, the airtight chamber 36 shown in FIGS. 1 to 4 may be used as a reticle load lock chamber. In this case, almost at the same time as air in the load lock chamber is purged out with the inert gas, air in the pellicle space is also purged out with the inert gas through the inert gas supply nozzle and/or the discharge nozzle. This arrangement enables a standby time in the entirety of the exposure apparatus and a reticle replacement time to be shorted in comparison with the case of purging out air in the pellicle space with the inert gas. As a result, the productivity can be improved.

Further, at least one or more sets of the inert gas supply nozzle 29, the discharge nozzle 37, and the nozzle moving mechanisms 30, shown in FIGS. 1 to 4, may be provided in the reticle storage device inside the airtight chamber 36. With that arrangement, a reticle, which is carried into the exposure apparatus, but not used for the exposure operation at once and once stored in the reticle storage device, can be carried into a predetermined slot of the reticle storage device in which one set of the above-mentioned nozzles, etc., is disposed without purging out air in the pellicle space of the carried-in reticle with the inert gas in the load lock chamber, and thereafter air in the pellicle space of the carried-in reticle can be purged out with the inert gas in the reticle storage device. As a result, a more sufficient purging time is ensured and the impurity concentration in the pellicle space can be reduced to a lower level. Another advantage is that a time required for purging out air in the pellicle space with the inert gas in the reticle load lock chamber can be cut down.

The place where the inert gas supply nozzle 29, the discharge nozzle 37 and the nozzle moving mechanisms 30 are disposed is not limited to the reticle stage, the reticle storage device, or the reticle load lock chamber, but they may be disposed in a pellicle inspecting apparatus or midway of a reticle carrying path in an enclosed chamber. Also, the place where those components are disposed is not limited to one, but they may be disposed in plural locations so that purging-out of air with the inert gas in an optimum place is automatically selected and performed to match with the schedule for usage of each reticle.

Fifth Embodiment

Figure 5:
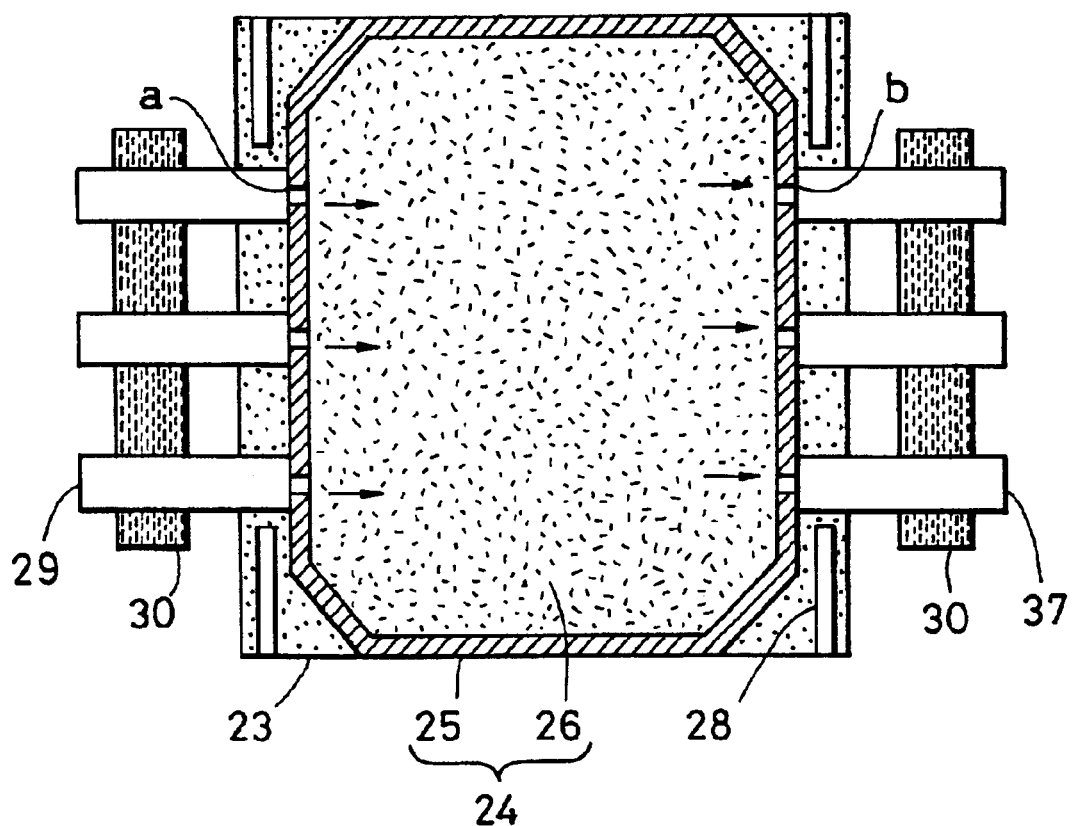
FIG. 5 shows one example of a nozzle arrangement in the purging apparatus using an inert gas according to a fifth embodiment of the present invention.

FIG. 5 shows one example of an arrangement of the inert gas supply nozzle and the discharge nozzle according to a fifth embodiment of the present invention. FIG. 5 is a plan view of a pellicle-equipped reticle looking from the side of the reticle to which a pellicle is bonded (from the side of a projection lens).

Referring to FIG. 5, a plurality of inert gas supply nozzles 29 and a plurality of discharge nozzles 37 are arranged on both sides of the pellicle frame in an opposed relation. By thus arranging a plurality of nozzles in distributed positions with respect to the pellicle space for the supply and discharge of the inert gas through the plurality of nozzles, the efficiency of replacing air in the pellicle space with the inert gas can be improved and the purging time can be cut down.
Sixth Embodiment FIG. 6 shows another example of an arrangement of the inert gas supply nozzle and the discharge nozzle according to a sixth embodiment of the present invention.

Figure 6:
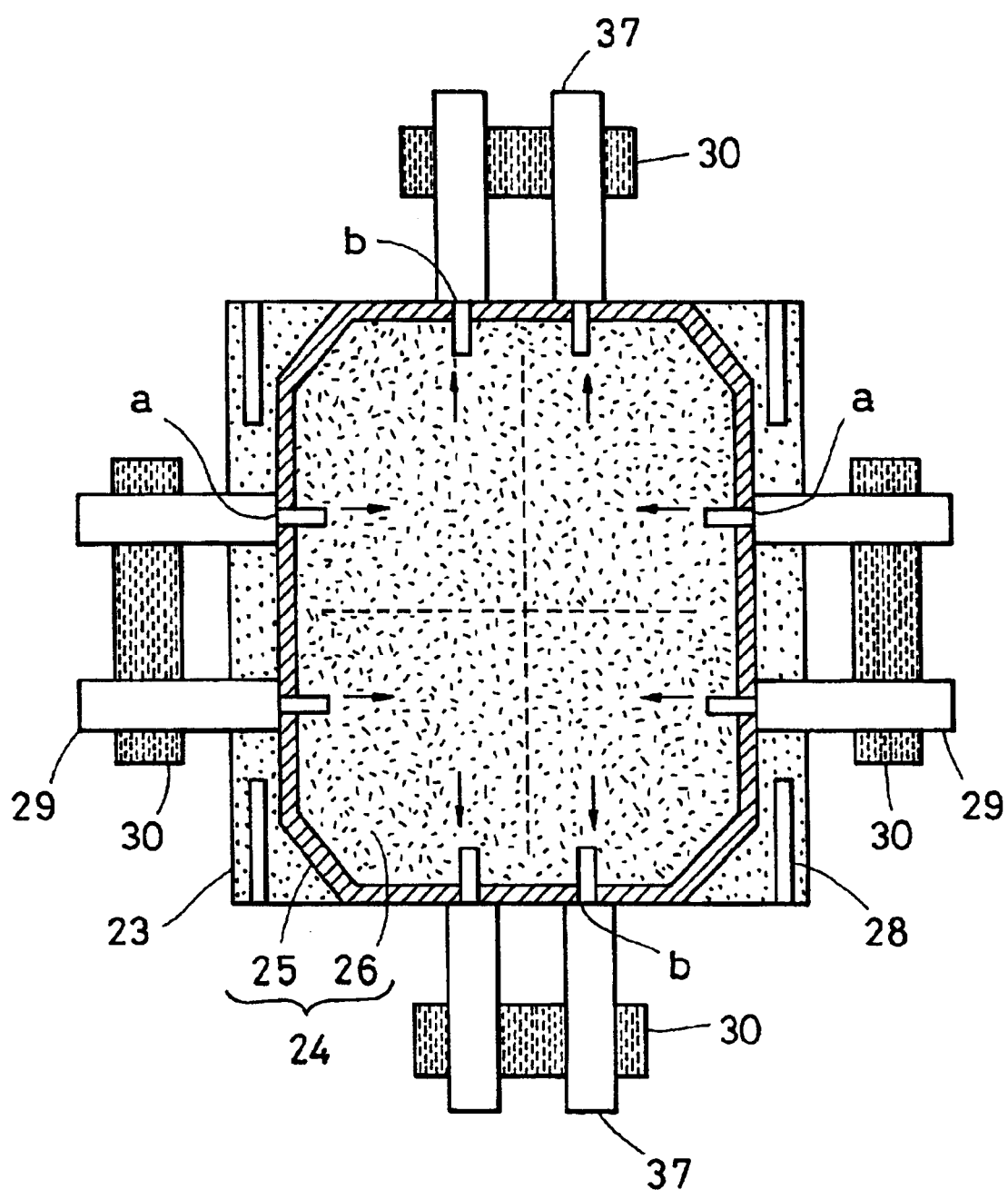
FIG. 6 shows another example of a nozzle arrangement in the purging apparatus using an inert gas according to a sixth embodiment of the present invention.

Referring to FIG. 6, two pairs of inert gas supply nozzles 29 are arranged on both sides of the pellicle frame in an opposed relation. Two pairs of discharge nozzles 37 are arranged on both sides of the pellicle frame in an opposed relation in a direction perpendicular to the two pairs of supply nozzles 29. By thus arranging two pairs of supply nozzles and two pairs of discharge nozzles along four sides of the pellicle frame in an opposed relation, the volume in which air is to be replaced with the inert gas by each pair of supply and discharge nozzles is ¼ of the total pellicle space. Accordingly, the gas replacement efficiency can be further improved.

Also, as shown in FIG. 6, a tip of each nozzle may be inserted so as to be located inside the pellicle frame or to enter the pellicle space. By so inserting the nozzle tip, a deterioration of airtightness can be avoided even if there is a slight gap between the pellicle frame and the nozzle. Further, by forming the nozzle tip to have a stepped portion as shown in FIG. 6, a surface area of the nozzle confronting or contacting an outer surface of the pellicle frame can be increased, which contributes to further improving the airtightness between the pellicle frame and the nozzle.
Seventh Embodiment FIG. 7 shows still another example of an arrangement of the inert gas supply nozzle and the discharge nozzle according to a seventh embodiment of the present invention.

Figure 7:
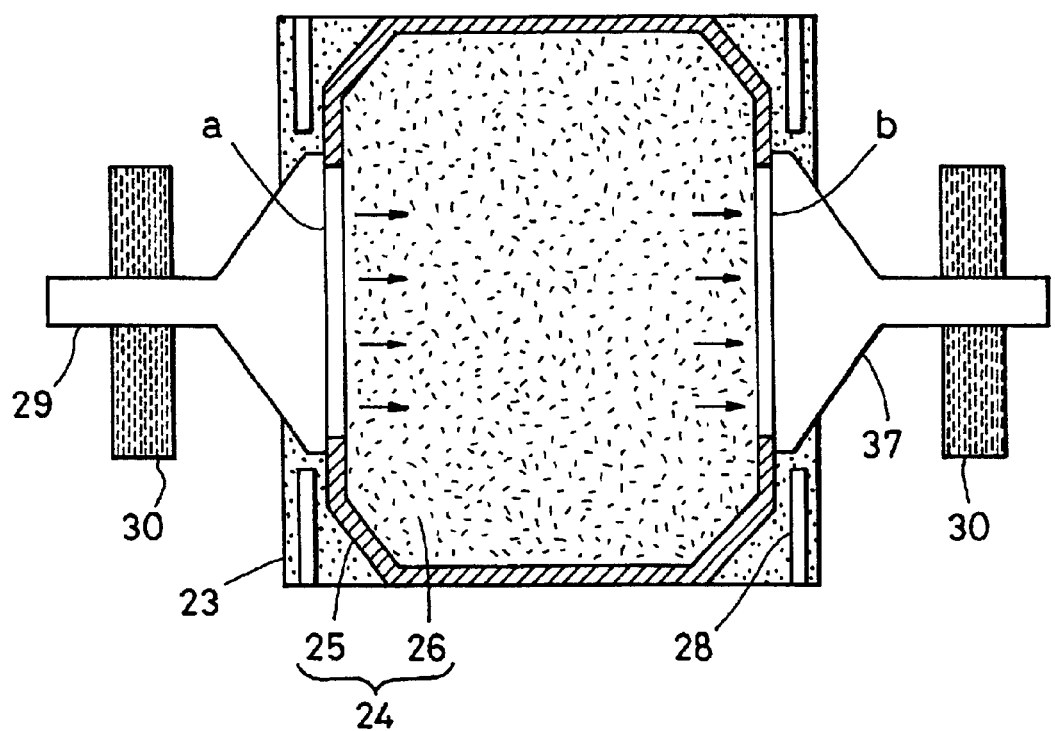
FIG. 7 shows still another example of a nozzle arrangement in the purging apparatus using an inert gas according to a seventh embodiment of the present invention.

Referring to FIG. 7, a pair of an inert gas supply nozzle 29 and a discharge nozzle 37 are arranged on both sides of the pellicle frame in an opposed relation. In this embodiment, the nozzles 29, 37 are each formed to have a wide opening. More specifically, an end surface of each nozzle is formed such that its size in the longitudinal direction is larger than at least the height of the pellicle frame. By thus setting the nozzle width to be as close as possible to the length of one side of the pellicle frame, it is possible to cause the inert gas to flow more uniformly over the entire area of the pellicle space, and to reduce areas where a flow of the inert gas stagnates. As a result, higher gas replacement efficiency can be achieved.

While in the examples of FIGS. 5 to 7, the inert gas supply nozzle and the discharge nozzle are both provided, only one of those nozzles may be provided and the other nozzle may be replaced with a simple opening formed in the pellicle frame. Generally, the reticle is square in plan shape, whereas the pellicle frame is rectangular in plan shape from restrictions imposed on the overall layout in the exposure apparatus, such as the positional relationship between the pellicle frame and the reticle support on the reticle stage. The inert gas supply nozzle and the discharge nozzle may be disposed along any of a long side and a short side of the rectangular pellicle frame. Further, depending on the shape of the pellicle frame, those nozzles may be obliquely disposed at one or all of four corners of the pellicle frame. For the nozzle arrangement, other various patterns are also conceivable, including the case where the nozzles are arranged in zigzag patterns in an opposed relation. In addition, the inert gas may be obliquely blown into the pellicle space or blown so as to radially diverge in the pellicle space, through the supply nozzle 29.

Stated otherwise, the present invention involves the cases in which the nozzle arrangements and shapes shown in FIGS. 5 to 7 are applied as appropriate in combination with the above-described embodiments of FIGS. 1 to 4.
Eighth Embodiment FIG. 8 shows one example of the inert gas supply nozzle and the discharge nozzle according to an eighth embodiment of the present invention.

Figure 8:
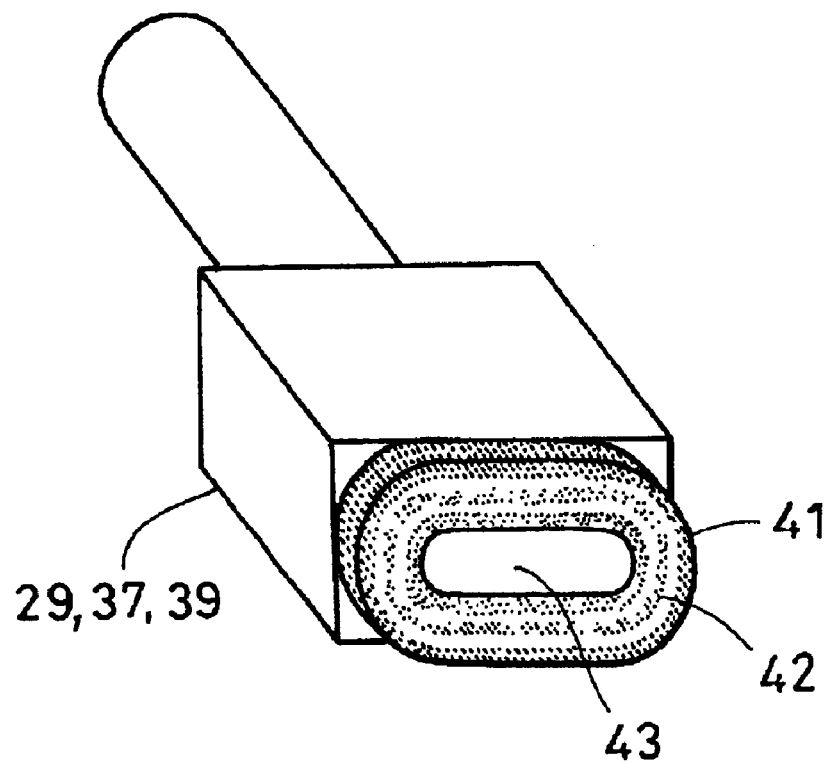
FIG. 8 shows one example of a nozzle in the purging apparatus using an inert gas according to an eighth embodiment of the present invention.

Referring to FIG. 8, at a distal end of each nozzle 29, 37, 39, a suction groove 42 for vacuum attraction is formed around a nozzle opening 43. The suction groove 42 is connected to a vacuum line through an on/off valve or the like. Also, at the nozzle distal end, a sealing member 41 is disposed in a surrounding relation to the suction groove 42. After the nozzle has been positioned by the nozzle moving mechanism 30 so as to closely contact with or be slightly spaced from the pellicle frame, the on/off valve is opened to produce a negative pressure in the suction groove 42 through the vacuum line, whereby the sealing member 41 is more closely contacted with the pellicle frame under vacuum attraction. Accordingly, the inert gas can be more surely prevented from leaking to the exterior of the pellicle space, and a deterioration in efficiency of replacing air in the pellicle space with the inert gas can be avoided. The sealing member 41 may be any of fluorocarbon resins such as using PTFE and PFA, various kinds of rubber such as EPDM, and foams thereof.

Also, by bringing the nozzle into close contact with the pellicle frame under vacuum attraction through the suction groove 42, sufficiently close contact can be obtained therebetween without pressing the nozzle against the pellicle frame by, e.g., the driver of the nozzle moving mechanism. It is, therefore, possible not only to prevent deformations of the pellicle frame and the pellicle film and deformation of the reticle, which are possibly caused upon excessive pressing of the nozzle, but also to prevent detachment of the pellicle and breakage of the pellicle film. In addition, air in the pellicle space can be purged out with the inert gas without deteriorating image performance of the reticle, in particular, during the exposure operation.

Furthermore, the driver provided in the nozzle moving mechanism for moving the nozzle may be any of various motors. Alternatively, the driver may be a piston cylinder, a bellowphragm cylinder or the like using gas pressure as a driving source. Employing that type of driver is advantageous in that the pressure acting to press the nozzle against the pellicle frame can be directly adjusted by controlling the gas pressure applied, and the pressing force can be easily eliminated by releasing the gas pressure to zero after the nozzle has been attracted to the pellicle frame through the suction groove.

By applying any of the above-described embodiments to a projection exposure apparatus using an ultraviolet ray, e.g., a fluorine excimer laser, as a light source, air in a pellicle space of a pellicle-equipped reticle, which has been carried into the exposure apparatus, can be purged out with an inert gas in a short time with high efficiency. As a result, highly-accurate and stable exposure control can be performed without deteriorating productivity of the exposure apparatus, and a fine circuit pattern can be projected with good stability and performance.

EXAMPLES OF SEMICONDUCTOR PRODUCTION SYSTEM

A description is now made of examples of a production system for semiconductor devices (including semiconductor chips such as ICs and LSIs, liquid crystal panels, CCDs, thin film magnetic heads, and micromachines). This production system is intended to perform maintenance services, such as trouble shooting actions, routine maintenance and presentation of software, of manufacturing equipment installed in a semiconductor manufacturing factory by utilizing a computer network outside the manufacturing factory.

Figure 9:
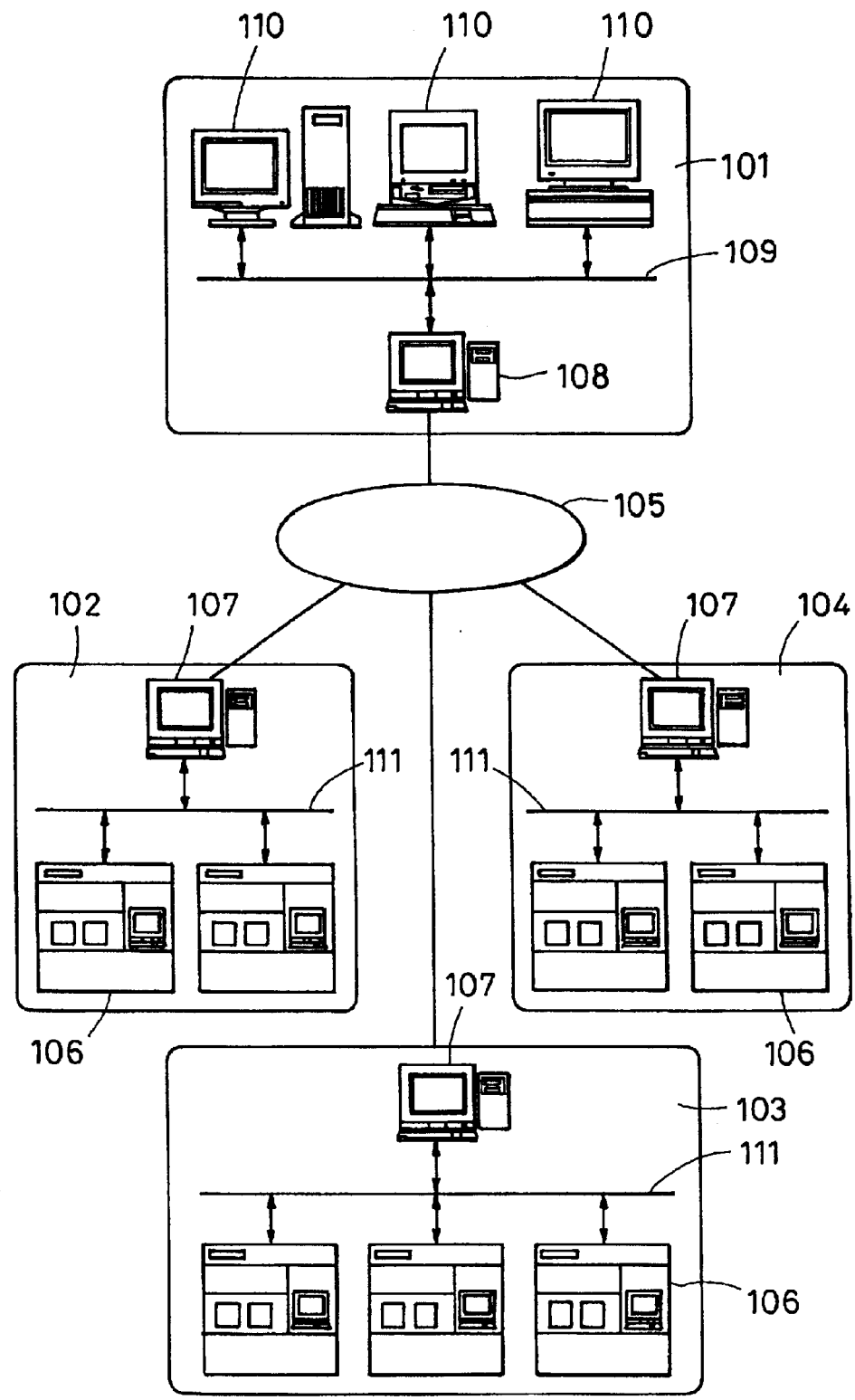
FIG. 9 is a conceptual diagram showing one example of a semiconductor device production system.

FIG. 9 is a conceptual diagram representing one example of the entire production system looking from one aspect. Referring to FIG. 9, reference numeral 101 denotes a plant office of a vendor (equipment supply maker) providing equipment for manufacturing semiconductor devices. Practical examples of the manufacturing equipment include semiconductor manufacturing apparatuses employed in semiconductor manufacturing factories for various processes, such as preceding-step equipment (e.g., lithography equipment including an exposure apparatus, a resist treating apparatus and an etching apparatus, a heat treating apparatus, a film forming apparatus, and a flattening apparatus), and succeeding-step equipment (e.g., an assembling apparatus and an inspecting apparatus). The plant office 101 includes a host management system 108 for providing a maintenance database for the manufacturing equipment, a plurality of operation terminal computers 110, and a local area network (LAN) 109 interconnecting them to construct an intranet. The host management system 108 has a gateway for connection of the LAN 109 to the Internet 105 that is an external network outside the plant office, and also has a security function for limiting access from the outside.

On the other hand, numerals 102 to 104 denote manufacturing factories of semiconductor manufacturing makers who are users of the above manufacturing equipment. The manufacturing factories 102 to 104 may be ones belonging to different makers or ones (e.g., a preceding-step factory and a succeeding-step factory) belonging to the same maker. Each of the manufacturing factories 102 to 104 includes plural pieces of manufacturing equipment 106, a local area network (LAN) 111 interconnecting them to construct an intranet, and a host management system 107 as a monitoring apparatus for monitoring the operation status of each piece of manufacturing equipment 106. The host management system 107 provided in each of the manufacturing factories 102 to 104 has a gateway for connection of the LAN 111 in the factory to the Internet 105 as the external network outside the factory. That connection enables an access to be made from the LAN 111 in the factory to the host management system 108 on the vendor 101 side via the Internet 105. Thus, limited users are only allowed to make an access by the security function of the host management system 108. More specifically, via the Internet 105, the user notifies status information (e.g., symptoms of the manufacturing equipment having caused trouble) indicating the operation status of each piece of manufacturing equipment 106 from the factory side to the vendor side, and receives response information (e.g., information indicating an action to cope with the trouble, software and data used in taking an action, etc.) corresponding to the notification, updated software, and maintenance information such as help information from the vendor side. The communication protocol (TCP/IP) generally used in the Internet is employed for data communication between the manufacturing factories 102 to 104 and the vendor 101 and data communication within each factory via the LAN 111. Another dedicated network (such as ISDN), which can shut out an access from the third party and has high security, may be used instead of utilizing the Internet as the external network outside the factory. Also, the host management system is not limited to one provided from the vendor, and the user may construct a database and set it on the external network so that access to the database is allowed from a plurality of factories belonging to the user.

Figure 10:
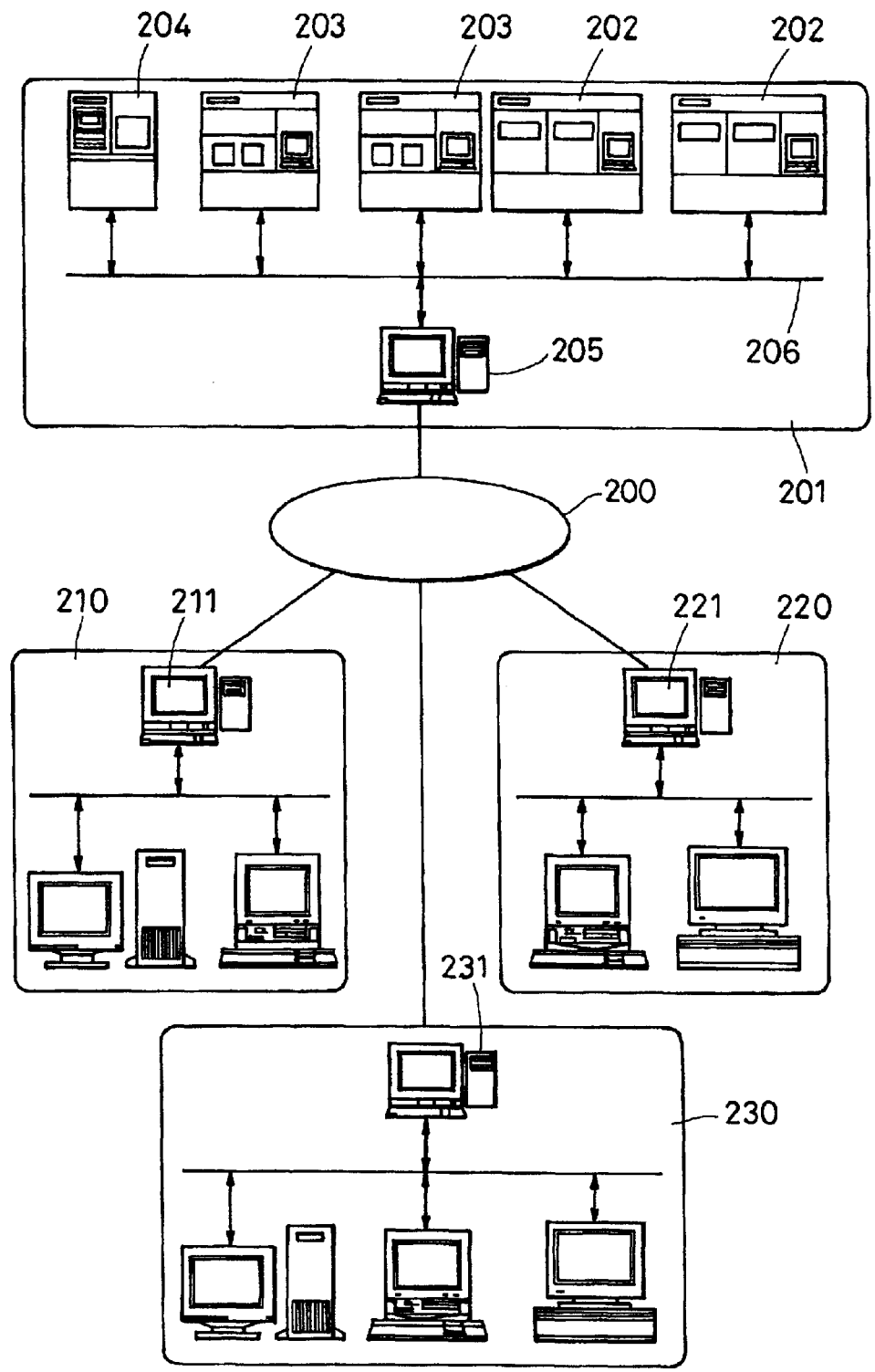
FIG. 10 is a conceptual diagram showing another example of a semiconductor device production system.

FIG. 10 is a conceptual diagram representing another example of the entire production system looking from another aspect. In the above example, a plurality of user factories each including at least one piece of manufacturing equipment are connected to a management system on the vendor side for managing the manufacturing equipment via an external network, and information regarding production management and at least one piece of manufacturing equipment in each factory is transferred through data communication using the external network. By contrast, in this example, a factory including plural pieces of manufacturing equipment provided from vendors is connected to management systems on the side of the respective vendors for managing the plural pieces of manufacturing equipment via an external network that is outside the factory, and maintenance information regarding each piece of manufacturing equipment is transferred through data communication. Referring to FIG. 10, numeral 201 denotes a factory of a manufacturing equipment user (e.g., a semiconductor device manufacturing maker). Along a production line in the factory, manufacturing equipment for performing various processes, e.g., an exposure apparatus 202, a resist treating apparatus 203 and a film forming apparatus 204, etc., are installed. Although only one manufacturing factory 201 is illustrated in FIG. 10, there are in fact a plurality of factories that are likewise provided with networks for data communication. The apparatuses in the factory are interconnected via a LAN 206 to construct an intranet, and a host management system 205 manages the operation of the production line. On the other hand, plant offices of the vendors (e.g., equipment supply makers), such as an exposure apparatus maker 210, a resist treating apparatus maker 220 and a film forming apparatus maker 230, respectively include host management systems 211, 221, 231 for performing remote maintenance of the equipment supplied from the makers. Each of those host management systems includes a maintenance database and a gateway for connection with the external network. The host management system 205 for managing the apparatuses in the user manufacturing factory is connected to the host management systems 211, 221, 231 in the plant offices of the vendors supplying those apparatuses via an external network 200 provided by the Internet or a dedicated network. In such a production system, if any trouble occurs in one of a series of the manufacturing apparatuses along the production line, the operation of the production line is stopped, but the user side can take prompt action by receiving information for remote maintenance via the Internet 200 from the vendor of the apparatus that has had the trouble occur. Accordingly, the suspension of the production line can be minimized.

Each of the manufacturing apparatuses installed in the semiconductor manufacturing factory includes a display, a network interface, and a computer for executing network accessing software and apparatus operating software, which are stored in a storage unit. The storage unit may be, e.g., a built-in memory, a hard disk, or a network file server. The network accessing software contains a dedicated or universal web browser, and presents a user interface screen shown, by way of example, in FIG. 11 on the display. An operator engaged in management of the manufacturing apparatuses in each factory inputs, while referring to the screen, information in entry items on the screen, such as model of the manufacturing apparatus (401), serial number (402), subject of trouble (403), date of occurrence (404), urgency level (405), symptoms (406), countermeasures (407), and proceedings (408). The entered information is sent to the maintenance database via the Internet, and proper maintenance information responsive to the sent information is replied from the maintenance database and presented on the display. As shown in FIG. 11, the user interface provided by the web browser also has hyperlink functions (410 to 412). Therefore, the operator can make an access to more detailed information for each item, can download software of the latest version, which is to be used for the manufacturing apparatus in the factory, from a software library provided by the vendor, and can download operation guides (help information) for reference to the operator in the factory. The maintenance information presented by the maintenance management system contains information regarding the above-described operation of purging air (impurities) out of the pellicle space, and the software library provides the latest software for realizing the purging-out of air from the pellicle space.

Figure 12:
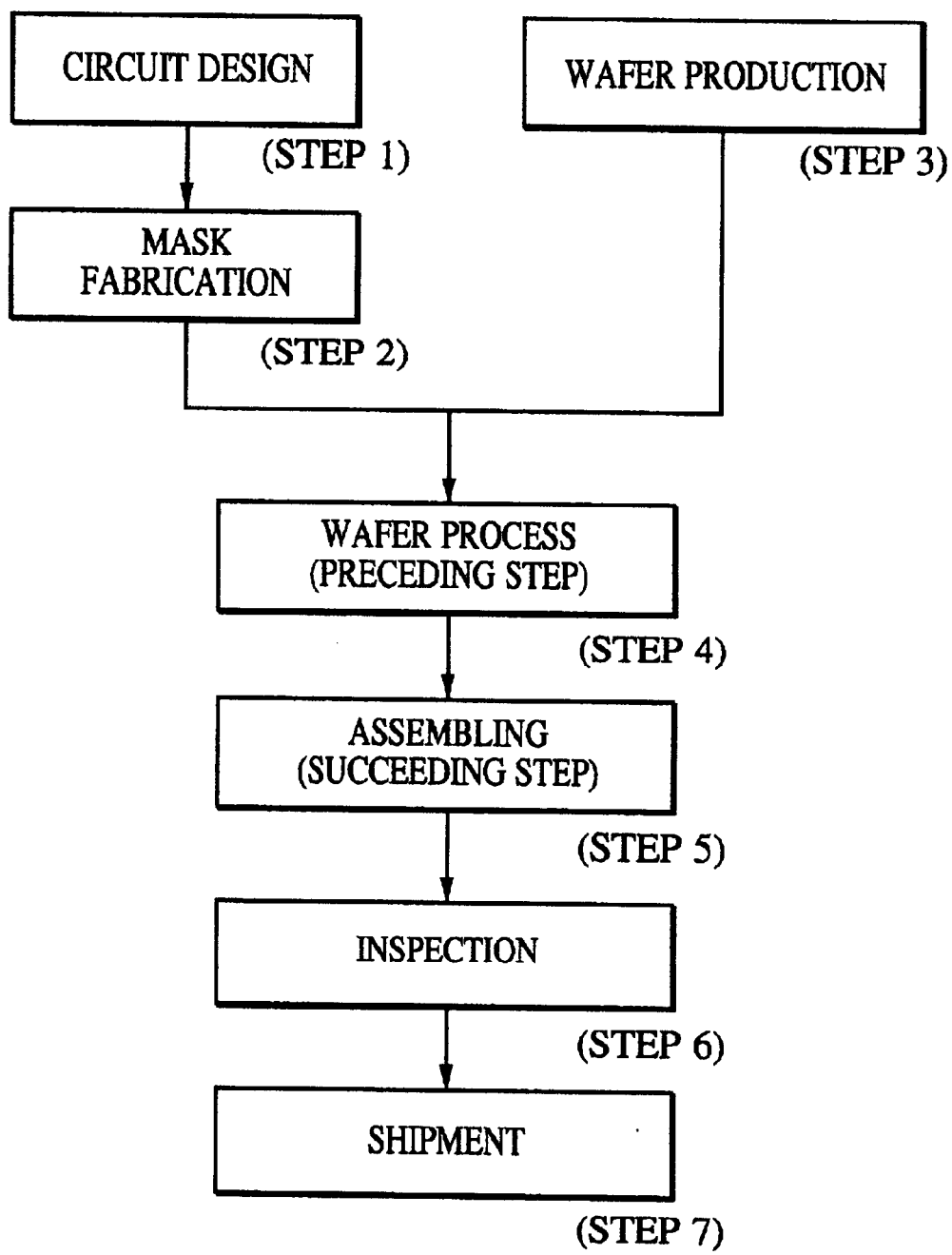
FIG. 12 is a diagram for explaining a flow of a device manufacturing process.

A description is now made of a semiconductor device manufacturing process utilizing the production system described above. FIG. 12 shows an overall flow of the semiconductor device manufacturing process. In step 1 (circuit design), circuit design of a semiconductor device is performed. In step 2 (mask fabrication), a mask is fabricated which is formed with a circuit pattern designed in step 1. On the other hand, in step 3 (wafer production), a wafer is produced using a proper material such as silicon. Step 4 (wafer process) is called a preceding step in which, using the mask and the wafer prepared in the above steps, an actual circuit is formed on the wafer by the lithography technique. The next step, step 5 (assembly), is called a succeeding step in which a semiconductor chip is fabricated using the wafer obtained in step 4. Step 5 includes an assembly step (dicing and bonding), a packaging step (chip sealing-in), and so on. Step 6 (inspection) performs inspection such as an operation check test and a durability test of a semiconductor device fabricated in step 5. The semiconductor device is completed through the above steps and then shipped (step 7). The preceding step and the succeeding step are performed in separate factories, and in each of the factories, maintenance is carried out with the remote maintenance system described above. Additionally, information for production management and apparatus maintenance is transferred between the preceding-step factory and the succeeding-step factory through data communication using the Internet or a dedicated network.

Figure 13:
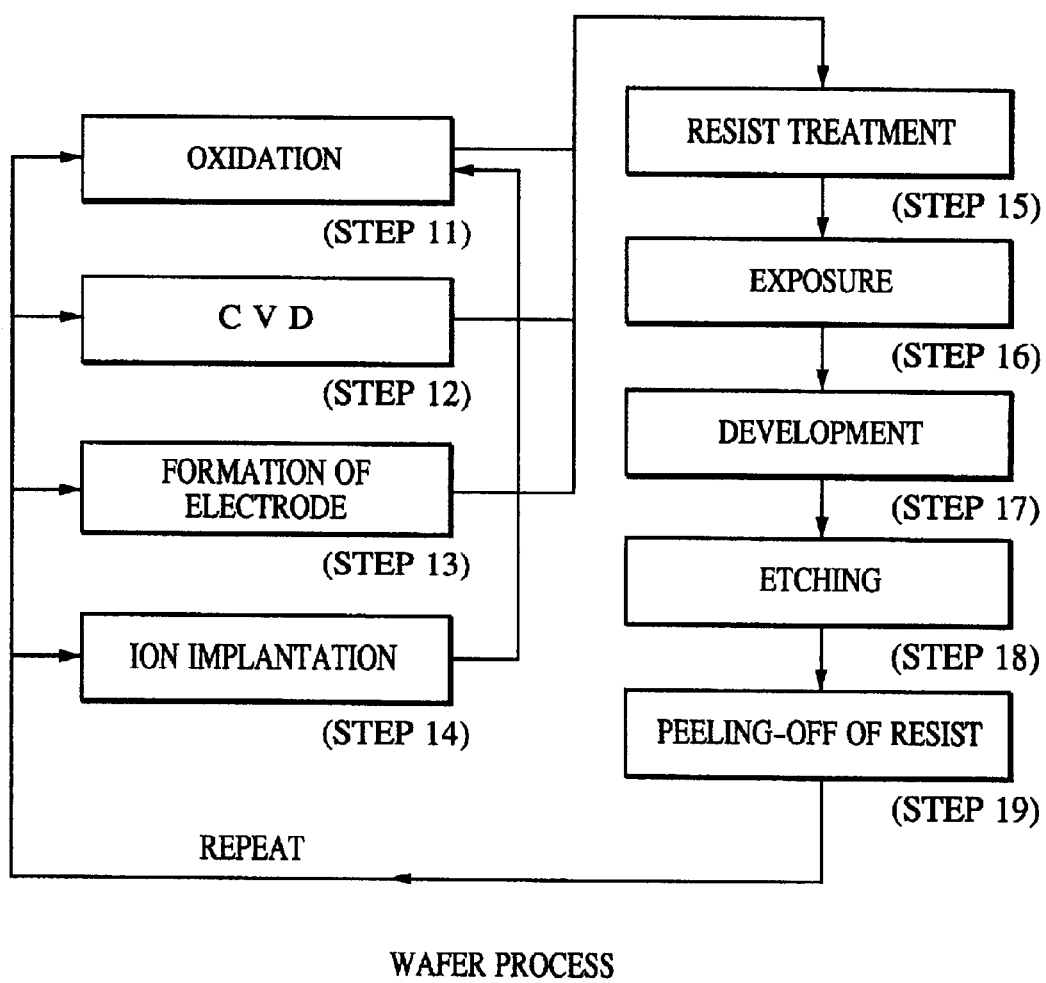
FIG. 13 is a diagram for explaining a wafer process.

FIG. 13 shows a detailed flow of the wafer process described above. In step 11 (oxidation), the wafer surface is oxidized. In step 12 (CVD), an insulating film is formed on the wafer surface. In step 13 (electrode formation), electrodes are formed on the wafer by vapor deposition. In step 14 (ion implantation), ions are implanted in the wafer. In step 15 (resist treatment), a photoresist is coated on the wafer. In step 16 (exposure), the circuit pattern of the mask is printed on the wafer with exposure light by using the exposure apparatus described above. In step 17 (development), the wafer having been subjected to the exposure light is developed. In step 18 (etching), an area other than a developed resist image is etched away. In step 19 (resist peeling-off), the resist is removed which has become unnecessary after the etching. By repeating the above-described steps, a multi-layered circuit pattern is formed on the wafer. Since maintenance of the manufacturing apparatus used in each step is performed with the remote maintenance system described above, it is possible to protect the manufacturing apparatus against trouble. Even if any trouble occurs, the apparatus can be promptly recovered and the productivity of the semiconductor devices can be improved in comparison with that in the related art.

According to the present invention, as described above, since air including impurities in a pellicle space can be purged out with an inert gas, a reduction in transmittance of exposure light through the pellicle space can be suppressed and the exposure operation can be performed with stability.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus comprising:
 a support for holding a pellicle-equipped reticle, the pellicle-equipped reticle including a pellicle frame having an opening; and
 a nozzle for causing an inert gas to flow through the opening formed in the pellicle frame of the reticle held on said support at a controlled flow rate to replace gas in a pellicle space surrounding the reticle, the pellicle frame and a pellicle film; and
 a moving member for moving the nozzle into an aligned relation to the opening.

2. An exposure apparatus according to claim 1, wherein said nozzle supplies an inert gas to the pellicle space.

3. An exposure apparatus according to claim 1, wherein said nozzle discharges gas from the pellicle space.

4. An exposure apparatus according to claim 1, wherein said nozzle includes a supply nozzle for supplying an inert gas to the pellicle space and a discharge nozzle for discharging gas from the pellicle space.

5. An exposure apparatus according to claim 1, wherein the moving member comprises a positioning mechanism for aligning positions of said nozzle and the opening relative to each other.

6. An exposure apparatus according to claim 1, wherein said nozzle is provided on a reticle stage.

7. An exposure apparatus according to claim 1, wherein said nozzle is provided in a reticle storage device.

8. An exposure apparatus according to claim 1, wherein said nozzle is provided in a load lock chamber.

9. An exposure apparatus according to claim 1, further comprising a pressure sensor for detecting a pressure of, and a flow regulator for controlling a flow rate of the inert gas supplied or discharged, said flow regulator being regulated in accordance with the pressure detected by said pressure sensor.

10. An exposure apparatus according to claim 9, wherein said flow regulator is regulated so that the detected pressure detected by said pressure sensor is held not higher than a predetermined value.

11. An exposure apparatus according to claim 9, wherein said pressure sensor detects a pressure in the pellicle space.

12. An exposure apparatus according to claim 9, further comprising a pressure detecting nozzle provided in an opposed relation to a pressure detecting opening formed in the pellicle frame, wherein said pressure sensor detects the pressure using said pressure detecting nozzle.

13. An exposure apparatus according to claim 12, wherein said pressure sensor is disposed in said pressure detecting nozzle or in a path communicating with said pressure detecting nozzle.

14. An exposure apparatus according to claim 9, wherein said pressure sensor is disposed in said nozzle or in a path communicating with said nozzle.

15. An exposure apparatus according to claim 9, wherein said pressure sensor detects a pressure difference between a pressure in the pellicle space and a pressure in a space in which the pellicle is placed.

16. An exposure apparatus according to claim 1, further comprising a concentration sensor for detecting a concentration of, and a flow regulator for controlling a flow rate of the inert gas supplied or discharged, said flow regulator being regulated in accordance with the concentration detected by said concentration sensor.

17. An exposure apparatus according to claim 16, wherein said concentration sensor is disposed midway of a path through which gas in the pellicle space is discharged.

18. An exposure apparatus according to claim 16, sensor detects an impurity concentration in the inert gas.

19. An exposure apparatus according to claim 16, wherein said concentration sensor is an atmospheric pressure ionization sensor.

20. An exposure apparatus according to claim 1, further comprising a controller for controlling a supply pressure of the inert gas supplied to the pellicle space and a discharge pressure for discharging gas from the pellicle space to be equal to or lower than respective predetermined values.

21. An exposure apparatus according to claim 1, wherein a pressure difference between a supply pressure of the inert gas supplied to the pellicle space and a discharge pressure for discharging gas from the pellicle space is controlled to be not higher than a predetermined value.

22. An exposure apparatus according to claim 1, wherein a flow rate of the inert gas supplied to the pellicle space and a flow rate of gas discharged from the pellicle space are controlled to be substantially equal to each other.

23. An exposure apparatus according to claim 4, wherein said supply nozzle and said discharge nozzle are arranged on either side of the pellicle frame in an opposed relation.

24. An exposure apparatus according to claim 4, wherein said supply nozzle and said discharge nozzle are arranged on either side of the pellicle frame in an orthogonal relation.

25. An exposure apparatus according to claim 1, wherein a size of said nozzle in the longitudinal direction is greater than at least the height of the pellicle frame.

26. An exposure apparatus according to claim 1, wherein said nozzle has a suction groove formed in an end surface thereof.

27. An exposure apparatus according to claim 1, wherein said nozzle has a sealing member provided on an end surface thereof.

28. An exposure apparatus according to claim 1, wherein said support is provided in an enclosed chamber, and said exposure apparatus further comprises a mechanism for purging out gas from the enclosed chamber.

29. An exposure apparatus according to claim 1, further comprising an excimer laser as a light source.

30. An exposure apparatus according to claim 29, wherein said light source is an ArF excimer laser or a fluorine excimer laser.

31. A method of manufacturing a semiconductor device, comprising the steps of:
    installing a group of manufacturing apparatuses for various processes, including an exposure apparatus according to claim 1, in a semiconductor device manufacturing factory; and
    manufacturing a semiconductor device through the various processes by employing said group of manufacturing apparatuses.

32. A gas substituting apparatus comprising:
    a support for holding a pellicle-equipped reticle, the pellicle-equipped reticle including a pellicle frame having an opening; and
    a nozzle for causing an inert gas to flow through the opening formed in the pellicle frame of the reticle held on said support at a controlled flow rate to replace gas in a pellicle space surrounding the reticle, the pellicle frame and a pellicle film; and
    a moving member for moving the nozzle into an aligned relation to the opening.

33. A gas substituting method comprising the steps of:
    holding a pellicle-equipped reticle, the pellicle-equipped reticle including a pellicle frame having an opening;
    moving a nozzle in an aligned relation to the opening formed in the pellicle frame by a moving member; and
    using the nozzle to cause an inert gas to flow through the opening at a controlled flow rate to replace gas in a pellicle space surrounding the reticle, the pellicle frame and a pellicle film.

* * * * *